United States Patent [19]

Minakuchi

[11] 4,191,927
[45] Mar. 4, 1980

[54] MIXING CIRCUIT FOR DIGITAL SIGNALS

[75] Inventor: Hiroshi Minakuchi, Takashima, Japan

[73] Assignee: Matsushita Electric Industrial Co., Ltd., Kadoma, Japan

[21] Appl. No.: 873,496

[22] Filed: Jan. 30, 1978

[30] Foreign Application Priority Data

Feb. 8, 1977 [JP] Japan .................................. 52-13237

[51] Int. Cl.² .......................... H03K 1/18; H03K 5/20
[52] U.S. Cl. ...................................... 328/157; 328/61; 328/63
[58] Field of Search ........................ 328/157, 61, 63; 307/220 R, 221 R, 225 R

[56] References Cited

U.S. PATENT DOCUMENTS

| | | | |
|---|---|---|---|
| 3,624,518 | 11/1971 | Dildy | 328/63 |
| 3,730,994 | 5/1973 | Terry et al. | 328/63 X |
| 3,739,156 | 6/1973 | Gebellein et al. | 307/220 X |

*Primary Examiner*—John S. Heyman
*Attorney, Agent, or Firm*—Cushman, Darby & Cushman

[57] ABSTRACT

A circuit for mixing digital signals from two different signal sources which are applied to respective input terminals. The circuit includes a first bistable circuit and a second bistable circuit for mixing the two signals on a single time base and forming an output signal with an astable period of a length corresponding to several cycles of the signal applied at one input terminal and one cycle of the signal applied at the other input terminal.

20 Claims, 14 Drawing Figures

MIXING CIRCUIT FOR DIGITAL SIGNALS

BACKGROUND OF THE INVENTION

This invention relates to a digital signal mixing circuit which mixes two digital signals from different signal sources (in general their frequencies and phases are different) on a time base.

SUMMARY OF THE INVENTION

An object of the invention is to provide a mixing circuit for digital signals. The mixing circuit can insert any predetermined cycles of a digital signal applied to one input terminal, in one cycle of another digital signal applied to the other input terminal. Such circuit is very useful, for example, as a monostable circuit with high accuracy or a tone burst wave generator circuit.

The present invention makes these circuits realizable, by applying a reference frequency signal obtained from a crystal oscillator to one of the input terminals of the digital signal mixing circuit.

DETAILED DESCRIPTION OF THE INVENTION

A circuit of the invention has two input terminals X and Y. The circuit is so formed that an output signal has an astable period corresponding to any cycles of a signal wave applied to the terminal Y in one cycle of a signal wave applied to the terminal X.

Figure 1:
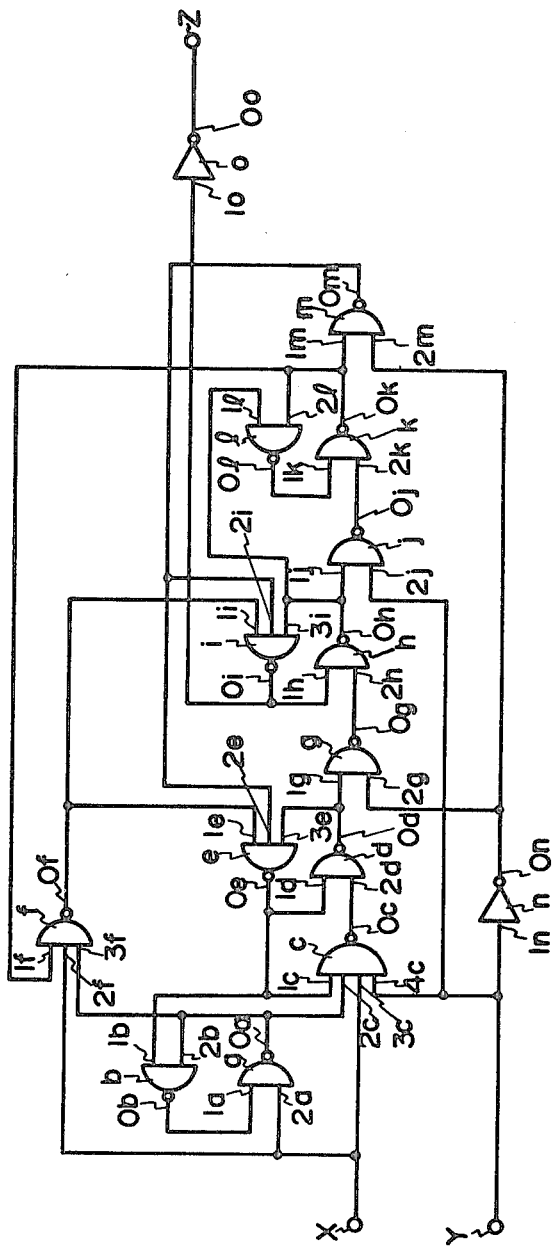
FIG. 1 is a circuit diagram of a digital signal mixing circuit for one practical example of the invention.

FIG. 1 shows a circuit diagram of a digital signal mixing circuit for one practical example of the invention. The digital signal mixing circuit of FIG. 1 is a fundamental example. The mixing circuit has two input terminals X and Y, and it is so formed that an output signal has an astable period corresponding to any cycles of a signal applied to the input terminal Y in an one-cycle period of a signal applied to the input terminal X.

In FIG. 1 the first signal input terminal X is connected to an input terminal 2a of a 2-input NAND gate a, an input terminal 3c of a 4-input NAND gate c and an input terminal 2f of a 3-input NAND gate f. An output terminal 0a of the 2-input NAND gate a is connected to an input terminal 2b of a 2-input NAND gate b, to an input terminal 2c of the 4-input NAND gate c, moreover to an input terminal 3f of the 3-input NAND gate f. An output terminal 0b of the 2-input NAND gate b is connected to an input terminal 1a of the 2-input NAND gate a.

The second signal input terminal Y, a reference signal input terminal, is connected to an input terminal 4c of the 4-input NAND gate c, an input terminal 2j of a 2-input NAND gate j and an input terminal 1n of an inverter n. An output terminal 0n of the inverter n is connected to an input terminal 2g of a 2-input NAND gate g and an input terminal 2m of a 2-input NAND gate m.

Moreover, an output terminal Oc of the 4-input NAND gate c is connected to an input terminal 2d of a 2-input NAND gate d. An output terminal 0d of the 2-input NAND gate d is connected to an input terminal 1g of the 2-input NAND gate g and to an input terminal 3e of a 3-input NAND gate e. An output terminal 0e of the 3-input NAND gate e is connected to an input terminal 1d of the 2-input NAND gate d, to an input terminal 1b of the 2-input NAND gate b and to an input terminal 1c of the 4-input NAND gate c.

An output terminal 0g of the 2-input NAND gate g is connected to an input terminal 2h of a 2-input NAND gate h. An output terminal 0h of the 2-input NAND gate h is connected to an input terminal 1j of the 2-input NAND gate j, to an input terminal 3i of a 3-input NAND gate i and to an input terminal 1l of a 2-input NAND gate l. An output terminal 0i of the 3-input NAND gate i is connected to an input terminal 1h of the 2-input NAND gate h and to an output terminal 1o of an inverter o. An output terminal 0o of the inverter o is connected to signal output terminal Z.

An output terminal 0j of the 2-input NAND gate j is connected to an input terminal 2k of a 2-input NAND gate k. An output termfinal 0k of the 2-input NAND gate k is connected to an input terminal 1m of the 2-input NAND gate m, to an input terminal 2l of the 2-input NAND gate l and to an input terminal 1f of the 3-input NAND gate f. An output terminal 0l of the 2-input NAND gate l is connected to an input terminal 1k of the 2-input NAND gate k. An output terminal 0m of the 2-input NAND gate m is connected to an input terminal 2e of the 3-input NAND gate e and to an input terminal 2i of the 3-input NAND gate e. An output terminal 0f of the 3-input NAND gate f is connected to an input terminal 1e of the 3-input NAND gate e and to an input terminal 1i of the 3-input NAND gate i.

Figure 2:
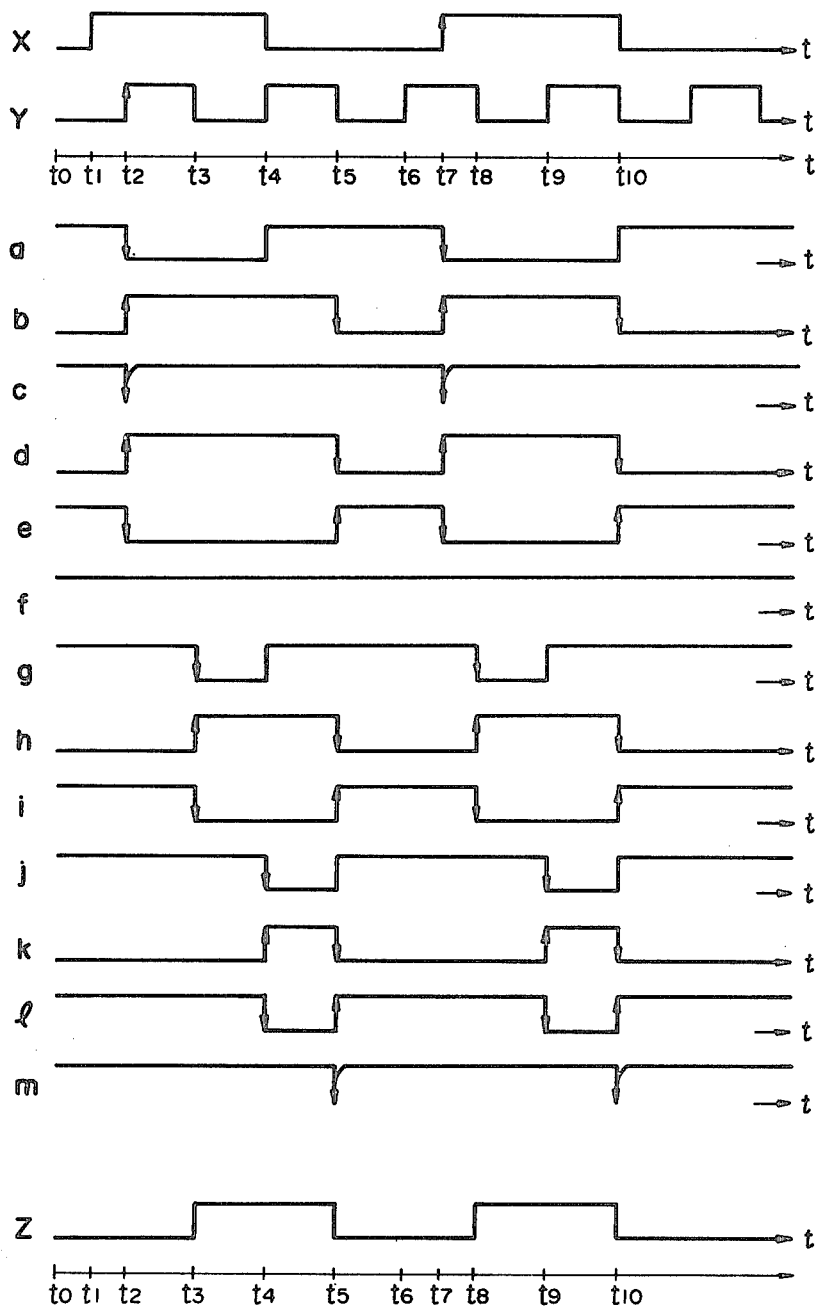
FIG. 2 and FIG. 3 are signal waveforms of various parts for explaining its function.

Now a working function is explained for the case that the signals of the waveforms shown in curves X and Y o FIG. 2 are applied to the signal input terminals X and Y of the digital signal mixing circuit shown in FIG. 1.

At $t=t_0$, as levels at the terminals X and Y are L (low level), the output level of the NAND gate a is H (high level), and the output level of the NAND gate c, the output level of the NAND gate f and the output level of the NAND gate j are H. And as the NAND gate e and NAND gate i were reset by the NAND gate m before $t=t_0$, both of their output levels are H. And accordingly, both output levels of the NAND gate b and NAND gate d are L.

On the other hand, although the output level of the inverter n is H, the output level of the NAND gate d is L, so the output level of the NAND gate g becomes H, and hence the output level ot the NAND gate h becomes L, resulting in that the output level of the NAND gate l also becomes H, and the output level of the NAND gate k is L. Therefore, the output level of the NAND gate m becomes H and the output level of the inverter o becomes L.

At $t=t_1$, although the signal level at the terminal X turns from L to H, the output levels of NAND gates a, c, e, f, g, i, j, l and m hold H, since some of their input terminals are L.

At $t=t_2$, the signal level at the terminal Y turns from L to H, and since the levels of the input terminals 1e, 2c and 3c of NAND gate c have already changed to H, the output level of the NAND gate c turns from H to L. At this moment, the output level of the NAND gate d turns from L to H, and the output level of the NAND gate e turns from H to L. Accordingly, the output level of the NAND gate b turns from L to H, and hence, the output level of the NAND gate a turns from H to L. When the output level of the NAND gate a turns from H to L, the output level of the NAND gate c goes back again from L to H. Curves a, b, c, d and e of FIG. 2 show the change of the output levels of the NAND gates a, b, c, d and e respectively.

At $t=t_3$, the signal level at the terminal Y turns from H to L, and this time the level of the input terminal 1g of the NAND gate g has changed to H, the output level of the NAND gate g turns from H to L. Accordingly the output level of the NAND gate h turns from L to H, and hence, the output level of the NAND gate i turns from H to L. Curves g, h and i of FIG. 2 show the output level changes of the NAND gates g, h and i respectively.

At $t=t_4$, the signal level at the terminal X turns from H to L, so the output level of the NAND gate a turns from L to H. Since the output level of the NAND gate e is still L, the output levels of the NAND gate b and NAND gate c show no change. At the same time, $t=t_4$, the signal level at the terminal Y turns from L to H, and the output level of the NAND gate g turns from L to H. As the level of the input terminal 1j of the NAND gate j has changed to H, the output level of the NAND gate j turns from H to L at this moment. Accordingly the output level of the NAND gate k turns from L to H, and hence, the output level of the NAND gate l from H to L.

Curves j, k and l of FIG. 2 show the changes of the output levels of NAND gates j, k and l respectively.

At $t=t_5$, when the signal level at the terminal Y turns from H to L, by the H level signal given through the inverter n the output level of the NAND gate m turns from H to L. And accordingly, the output levels of the NAND gate e and NAND gate i turn from L to H, and alos the output level of the NAND gate j turns from L to H. As the output level of the NAND gate e turns from L to H, the output levels of the NAND gate b and NAND gate d also turn from H to L. As the output level of the NAND gate i turns from L to H, the output level of the NAND gate h turns from H to L. Accordingly the output level of the NAND gate l turns from L to H, and hence, the output level of the NAND gate k turns from H to L.

As the output level of the NAND gate k turns from H to L, the output level of the NAND gate m again goes back to H from L, but the output levels of the NAND gate e and NAND gate i do not change, since other input terminal has changed to L. Curve m of FIG. 2 shows the output level change of the NAND gate m. The signal of waveforms shown by curve Z of FIG. 2 comes out at the signal output terminal Z.

At $t=t_6$, the signal level at the terminal Y turns from L to H, but the output levels of the NAND gates a, c, e, f, g, i, j, l and m do not change, since levels of some input terminals are L.

At $t=t_7$, the signal level at the terminal X turns from L to H, then the output level of the NAND gate c turns from H to L, since the levels at the terminals 1c, 2c and 3c of the NAND gate c is H.

At this moment, the output level of the NAND gate d turns from L to H, and the level of the NAND gate e turns from H to L. Accordingly, the output level of the NAND gate b turns from L to H, and hence, the output level of the NAND gate a turns from H to L. When the output level of the NAND gate a turns from H to L, the output level of the NAND gate c again goes back to H from L.

At $t=t_8$, the signal level at the terminal Y turns from H to L, then the output level of the NAND gate g turns from H to L, since the level at the input terminal 1g of the NAND gate g has changed to H. Accordingly, the output level of the NAND gate h turns from L to H, and hence, the output level of the NAND gate i turns from H to L.

At $t=t_9$, the signal level at the terminal Y turns from L to H, so the output level of the NAND gate g turns from L to H, and hence, the output level of the NAND gate j turns from H to L, since the level at the input terminal 1j of the NAND gate j has changed to H. Accordingly the output level of the NAND gate k turns from L to H, and hence, the output level of the NAND gate l turns from H to L.

At $t=t_{10}$, when the signal level at the terminal X turns from H to L, the output level of the NAND gate a turns from L to H. And hence, when the signal level at the terminal Y turns from H to L, the output level of the NAND gate m turns from H to L, and accordingly, the output levels of the NAND gate e and NAND gate i turn from L to H, and the output level of the NAND gate j turns from L to H.

When the output level of the NAND gate e turns from L to H, the output levels of the NAND gate b and NAND gate d turn from H to L. When the output level of the NAND gate i turns from L to H, the output level of the NAND gate h turns from H to L. Accordingly, the output level of the NAND gate l turns from L to H, and hence, the output level of the NAND gate k turns from H to L. When the output level of the NAND gate k turns from H to L, the output level of the NAND gate m goes back to H, but, the output levels of the NAND gate e and NAND gate i hold H, since the signal levels at other termdinals became L.

As seen in the example of stationary state operation shown in FIG. 2, the input signal X to the digital signal mixing circuit of FIG. 1 has the period of about 2.5 times of that of the input signal Y. In this case, the output signal of the digital signal mixing circuit shown by curve Z of FIG. 2 has an astable period corresponding to one cycle of the input signal Y applied to terminal Y. Signal waveforms shown by curve f of FIG. 2 shows that the output level of the NAND gate f of FIG. 1 keep holding H level in the abovementioned stationary state operation shown in FIG. 2. The NAND gate f functions in case of transitional state is described below.

Figure 3:
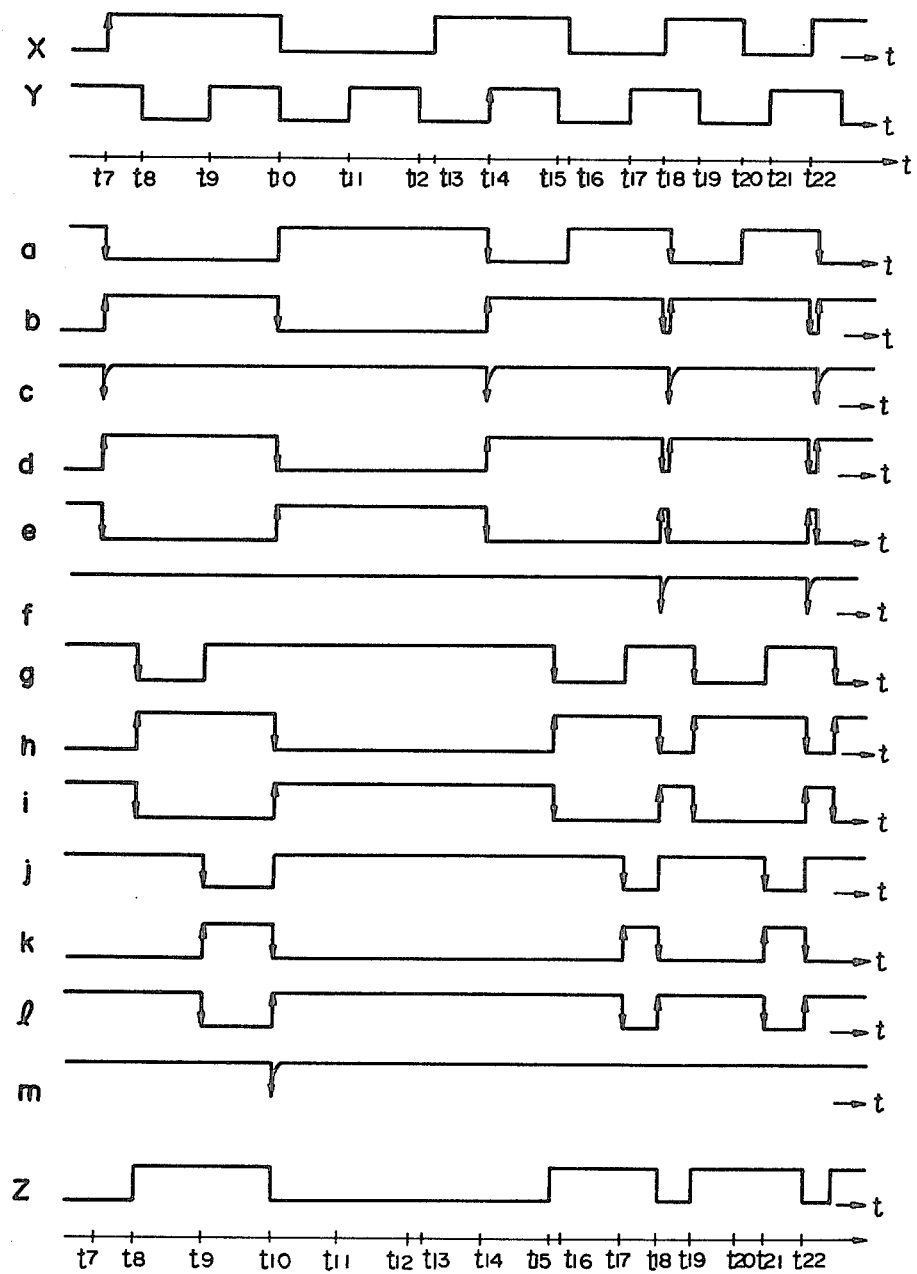

FIG. 3 is a signal waveform diagram, used for explaining the function of the NAND gate f.

At $t=t_{14}$, when the signal levels at the terminal X and terminal Y become H, the output level of the NAND gate c turns from H to L. Accordingly, the output level of the NAND gate d turns from L to H, and hence, the output level of the NAND gate e turns from H to L. Therefore the output level of the NAND gate c goes back to H and the output level of the NAND gate b turns from L to H, and hence, the output level of the NAND gate a turns from H to L.

At $t=t_{15}$, the signal level at the terminal Y turns from H to L, then the output level of the NAND gate g turns from H to L, and hence, the output level of the NAND gate h turns from L to H and the output level of the NAND gate i turns from H to L.

At $t=t_{16}$, the signal level at the terminal X turns from H to L, then the output level of the NAND gate a turns from L to H, but the output levels of other NAND gates show no change.

At $t=t_{17}$, the signal level at the terminal Y turns from L to H, then the output level of the NAND gate g turns from L to H. Since the output level of the NAND gate j turns from H to L, the output level of the NAND gate k turns from L to H, and hence, the output level of the NAND gate l turns from H to L. At this time, the levels at both input terminals 1f and 3f of the NAND gate f are H.

At $t=t_{18}$, the signal level at the terminal X turns from L to H, then the output level of the NAND gate f turns from H to L, and the output levels of the NAND gate e and NAND gate i turn from L to H. Accordingly, the output levels of the NAND gate d, NAND gate b NAND gate h and NAND gate k turn from H to L, and the output level of the NAND gate l turns from L to H. Immediately after this moment, the output level of the NAND gate c turns from H to L, and the output level of the NAND gate d turns from L to H and another new cycle period begins. Since the output level of the NAND gate k turns from H to L, just after the output level of the NAND gate f turns from H to L, so the output level of the NAND gate f soon goes back to H. At the same time, since the output level of the NAND gate d turns from L to H, the output level of the NAND gate e turns from H to L, and the output level of the NAND gate b turns from L to H, and hence, the output level of the NAND gate a becomes L.

At $t=t_{19}$, the output level of the NAND gate g turns from H to L, accordingly, the output level of the NAND gate h turns from L to H, and hence, the output level of the NAND gate i turns from H to L.

At $t=t_{20}$, the signal level at the terminal X turns from H to L, then the output level of the NAND gate a only turns from L to H.

At $t=t_{21}$, the signal level at the terminal Y turns from L to H, then the output level of the NAND gate g turns from L to H. Therefore, the output level of the NAND gate j turns from H to L, the output level of the NAND gate k turns from L to H, and hence, the output level of the NAND gate l turns from H to L.

At $t=t_{22}$, the signal level at the terminal X turns from L to H, then the output level of the NAND gate f turns from H to L. Thereafter, the same function repeats. That means, when the output level of the NAND gate k is H, upon turning of the signal level at the terminal X from L to H for example at $t=t_{18}$ or $t=t_{22}$, the NAND gate f generates a reset pulse of L level. The reset pulse resets the NAND gates e and i, and hence resets whole digital signal mixing circuit of FIG. 1 to the initial state at $t=t_0$. Therefore, the circuit can be triggered again by the turning from L to H of the input terminal X. Namely, by the function of the NAND gate f, the digital signal mixing circuit of FIG. 1 is reset in a manner not to lose reaction for the next trigger pulse to the input terminal X.

The digital signal mixing circuit of FIG. 1 is used for obtaining an output signal having an astable period corresponding to one cycle of a signal applied to the terminal Y in one cycle of a signal applied to the terminal X.

The circuit of FIG. 1 consists of the following functional blocks.

A first bistable circuit formed by the NAND gate c, NAND gate d and NAND gate e which changes its state from a first stable state (the output level of the NAND gate d is L and the output level of the NAND gate e is H) to a second stable state (the output level of the NAND d is H and the output level of the NAND gate e is L) when the level of the applied signal at the terminal X becomes H and the level of the applied signal at the terminal Y becomes H.

A second bistable circuit formed by the NAND gate g, NAND gate h, NAND gate i and inverter n which changes its state from a first stable state (the output level of the NAND gate h is L and the output level of the NAND gate i is H) to a second stable state (the output level of the NAND gate h is H and the output level of the NAND gae i is L) when the first bistable circuit enters into the second stable state and the level of the applied signal at the terminal Y becomes L.

A counter circuit formed by the NAND gate j, NAND gate k and NAND gate l counts only one cycle of the applied signal at the terminal Y after the second bistable circuit enters into the second table state.

A reset circuit formed by the NAND gate m which resets states of the first and second bistable circuits to the first stable state when the output level of the counter circuit reaches at a target value, i.e. when both level of the input terminals of the NAND gate m become H.

And finally an accessory circuit formed by the NAND gate a, NAND gate b and NAND gate f.

In the digital signal mixing circuit of the present invention, the construction of the counter circuit determines how many cycles of the signal applied to the terminal Y in one cycle of the signal applied to the terminal X. This means that one can freely select the number of cycles from one half of a cycle (min.) to theoretically infinite cycles (max.) by transforming the form of the counter circuit.

Figure 4:
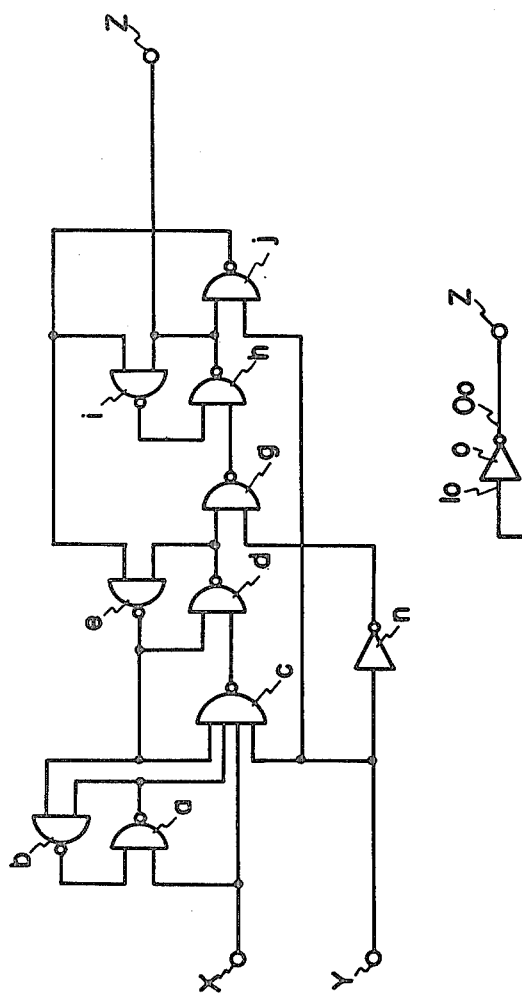
FIG. 4, FIG. 5 and FIG. 6 are circuit diagrams of digital signal mixing circuits for other practical examples of the invention.

One of the simplest example for the digital signal mixing circuit of the invention is shown in FIG. 4. A first bistable circuit is formed by a NAND gate c, NAND gate d and NAND gate e, and a second bistable circuit is formed by a NAND gate g, NAND gate h, NAND gate i and inverter n, same as the circuit of FIG. 1. The different points from the circuit of FIG. 1 are that a reset circuit is formed by a NAND gate j, there exists no NAND gate sfor a counter circuit and the counter circuit is formed by connecting an input terminal of the NAND gate j.

The digital signal mixing circuit shown in FIG. 4 is used for obtaining an output signal having an astable period correspondingd to a half cycle of a signal applied to a terminal Y in one cycle of the signal applied to a terminal X.

Figure 5:
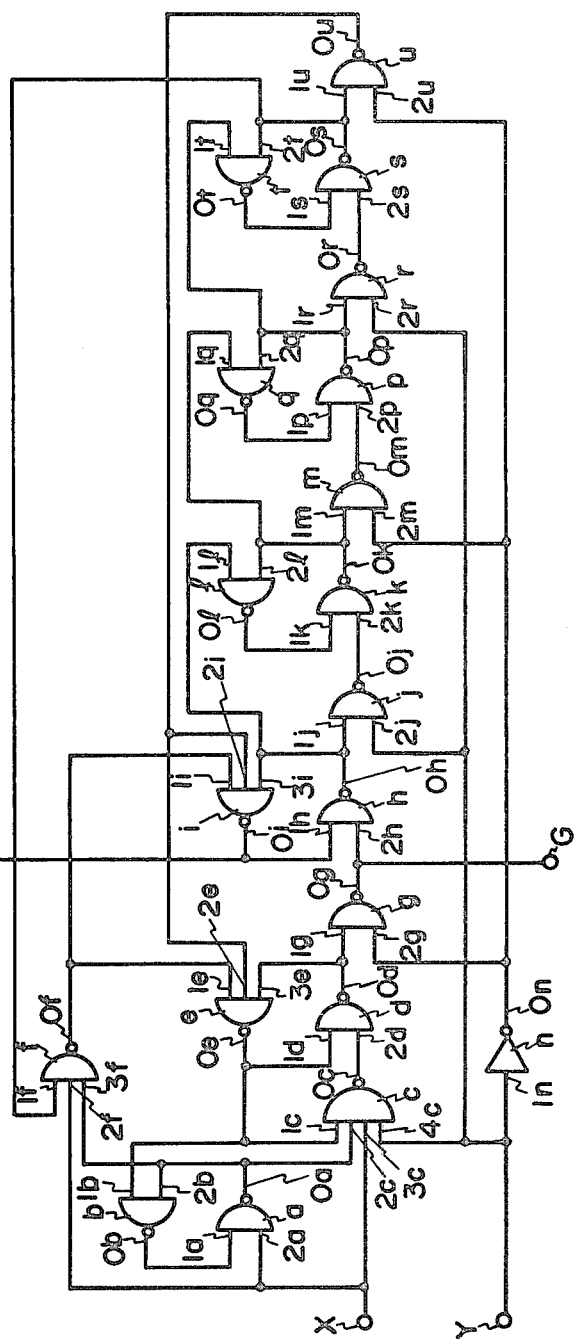

A digital signal mixing circuit shown in FIG. 5 for another practical example of the invention, is so constructed that an output signal has an astable period corresponding to two-cycle period of a signal applied to a terminal Y in one cycle of a signal applied to a terminal X.

A counter circuit is formed by a NAND gate j, NAND gate k, NAND gate l, NAND gate m, NAND gate p, NAND gate q, NAND gate r, NAND gates s and NAND gate t, and a reset circuit is formed by a NAND gate u.

By comparing the circuit of FIG. 4 with the circuit of FIG 5, one notices that the number of cycles of the signal applied to the terminal Y during one cycle of the signal applied to the terminal X increases by a half cycle for every increase of a pair of 3 NAND gates for the counter circuit (for example NAND gates j, k and l, or NAND gates m, p and q, etc.).

Therefore in order to increase the abovementioned number of signal to the Y terminal during the one cycle of the signal to the X-terminal, three NAND gates for half cycle of signal to be increased or six NAND gates for one cycle of the signal to be increased are necessary for the counter circuit. This leads to the complication of the circuit, if many cycles are requested to be mixed.

Figure 6:
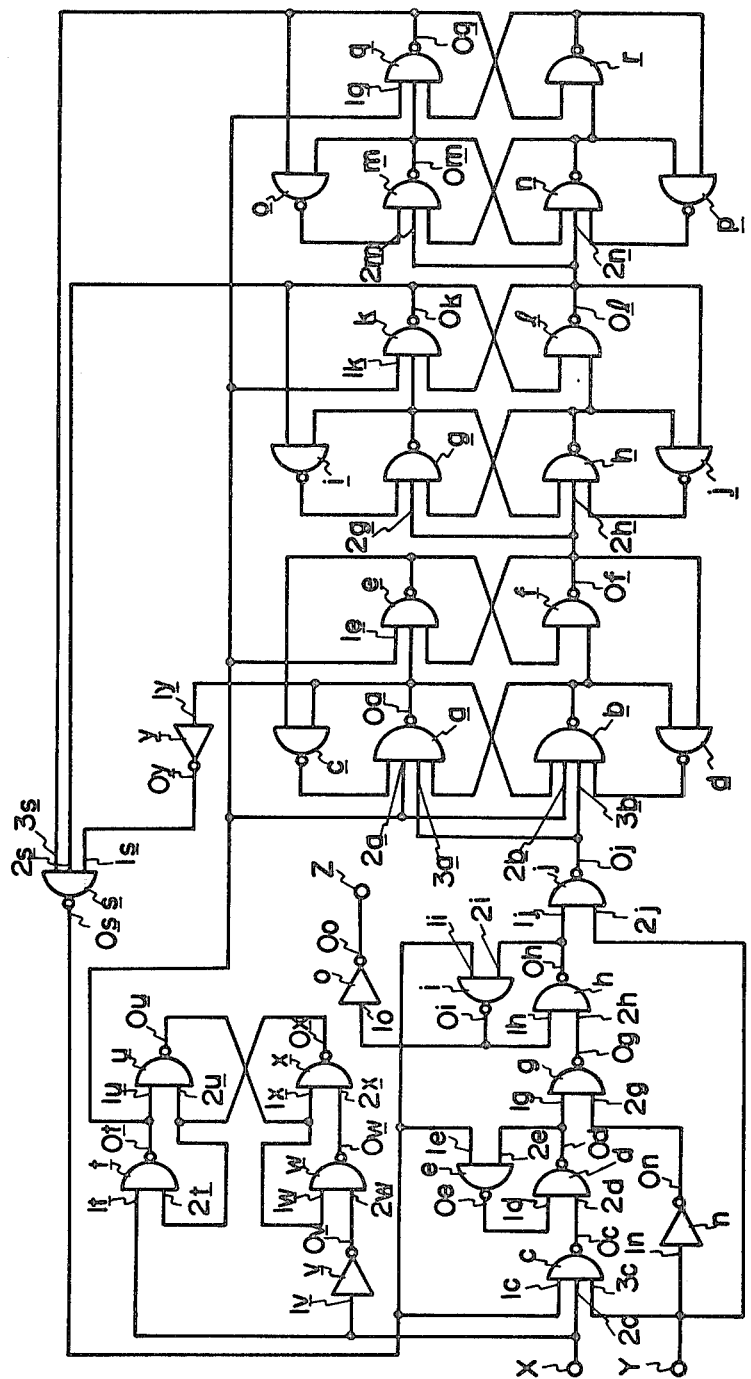

In order to eliminate such drawback, another practical example shown in FIG. 6 is so constructed that a signal of many cycles can be mixed with a small number of NAND gates. In this circuit, at the output terminal Z a signal having an astable time of the length of several cycles of signal wave at the terminal Y in one cycle of a signal at the terminal X. Also at the output terminal G, a tone burst signal of the same number with the cycles of the signal at the terminal Y in one cycle of the signal to the terminal X is issued.

In the circuit shown in FIG. 6, a first signal input terminal X is connected to a input terminal $2c$ of a 3-input NAND gate c, an input terminal $1v$ of an inverter v and an input terminal $1t$ pf a b 2-input NAND gate t. A second signal input terminal Y is connected to an input terminal $3c$ of the 3-input NAND gate c, an input terminal $1n$ of an inverter n and an input terminal $2j$ of a 2-input NAND gate j. An output terminal $0c$ of the 3-input NAND gate c is connected to an input terminal $2d$ of a 2-input NAND gate d. An output terminal $0d$ of the 2-input NAND gate d is connected to an input terminal $2e$ of a 2-input NAND gate e and an input terminal $1g$ of a 2-input NAND gate g. An output terminal $0e$ of the 2-input NAND gate e is connected to an input terminal $1d$ of the 2-input NAND gate d. An output terminal $Og$ of the 2-input NAND gate g is connected to an input terminal $2h$ of a 2-input NAND gate h and also to a tone burst output terminal G. An output terminal $Oh$ of the 2-input NAND gate h is connected to an input terminal $2i$ of a 2-input NAND gate i and an input terminal $1j$ of the 2-input NAND gate j. An output terminal $Oi$ of the 2-input NAND gate i is connected to an input terminal $1h$ of the 2-input NAND gate h and to an input terminal $1o$ of an inverter o. An output terminal $0o$ of the inverter o is connected to an output terminal Z.

An output terminal $0t$ of the 2-input NAND gate t is connected to an input terminal $1u$ of a 2-input NAND gate u and to each one terminals of an input terminal $2a$ of a 4-input NAND gate a, an input terminal $2b$ of a 4-input NAND gate b, an input terminal $1e$ of a 3-input NAND gate e, an input terminal $1k$ of a 3-input NAND gate k and an input terminal $1q$ of a3-input NAND gate q.

An output terminal $0u$ of the 2-input NAND gate u is connected to an input terminal $1w$ of a 2-input NAND gate w and an input terminal $1x$ of a 2-input NAND gate x. An output terminal $0v$ of the inverter v is connected to an input terminal $2w$ of the 2-input NAND gate w. An output $0w$ of the 2-input NAND gate w is connected to an input terminal $2x$ of the 2-input NAND gate x. An output terminal $0x$ of the 2-input NAND gate x is connected to an input terminal $2t$ of the 2-input NAND gare t and an input terminal $2u$ of the 2-input NAND gate u.

6 NAND gates, the 4-input NAND gate a, the 4-input NAND gate b, a 2-input NAND gate c, a 2-input NAND gate d, the 3-input NAND gate e and a 2-input NAND gate f, form a pair of well known Trigger-flip-flop (T-FF). Likewise a 3-input NAND gate g, a 3-input NAND gate h, a 2-input NAND gate i, a 3-input NAND gate j, the 3-input NAND gate k and a 2-input NAND gate 1 as well as a 3-input NAND gate m, a 3-input NAND gate n, a 2-input NAND gate o, a 2-input NAND gate p, the 3-input NAND gate q and a 2-input NAND gate r also form a second and a third pair of T-FFs.

An output terminal $0j$ of the 2-input NAND gate j is connected to an input terminal $3a$ of the 4-input NAND gate a and an input terminal $3b$ of the 4-input NAND gate b in the first-stage T-FF. An output terminal $0f$ of the 2-input NAND gate f in the first-stage T-FF, is connected to an input terminal $2g$ of the 3-input NAND gate g and an input terminal $2h$ of the 3-input NAND gate h, which from the 2-nd-stage T-FF. An output terminal $0l$ of the 2-input NAND gate 1 in the 2nd-stage T-FF is connected to an input terminal $2m$ of the 3-input NAND gate m and an input terminal $2n$ of the 3-input NAND gate n in the 3rd-stage T-FF.

An output terminal $0a$ of the 4-input NAND gate a is connected to an input terminal $1y$ of an inverter y. An output terminal $0y$ of the inverter y is connected to an input terminal $1s$ of a 3-input NAND gate s. An output terminal $0k$ of a 3-input NAND gate k in the 2nd-stage T-FF is connected to an input terminals $2s$ of the 3-input NAND gate s. An output terminal $0q$ of a 3-input NAND gate q in the 3rd-stage T-FF is connected to an input terminal $3s$ of the 3-input NAND gate s. An output terminal $0s$ of the 3-input NAND gate s is connected to an input terminal $1c$ of the 3-input NAND gate c, an input terminal $1e$ of the 2-input NAND gate e and an input terminal $1i$ of the 2-input NAND gate i. An output terminal $0n$ of the inverter n is connected to an input terminal $2g$ of the 2-input NAND gate g.

Figure 7:
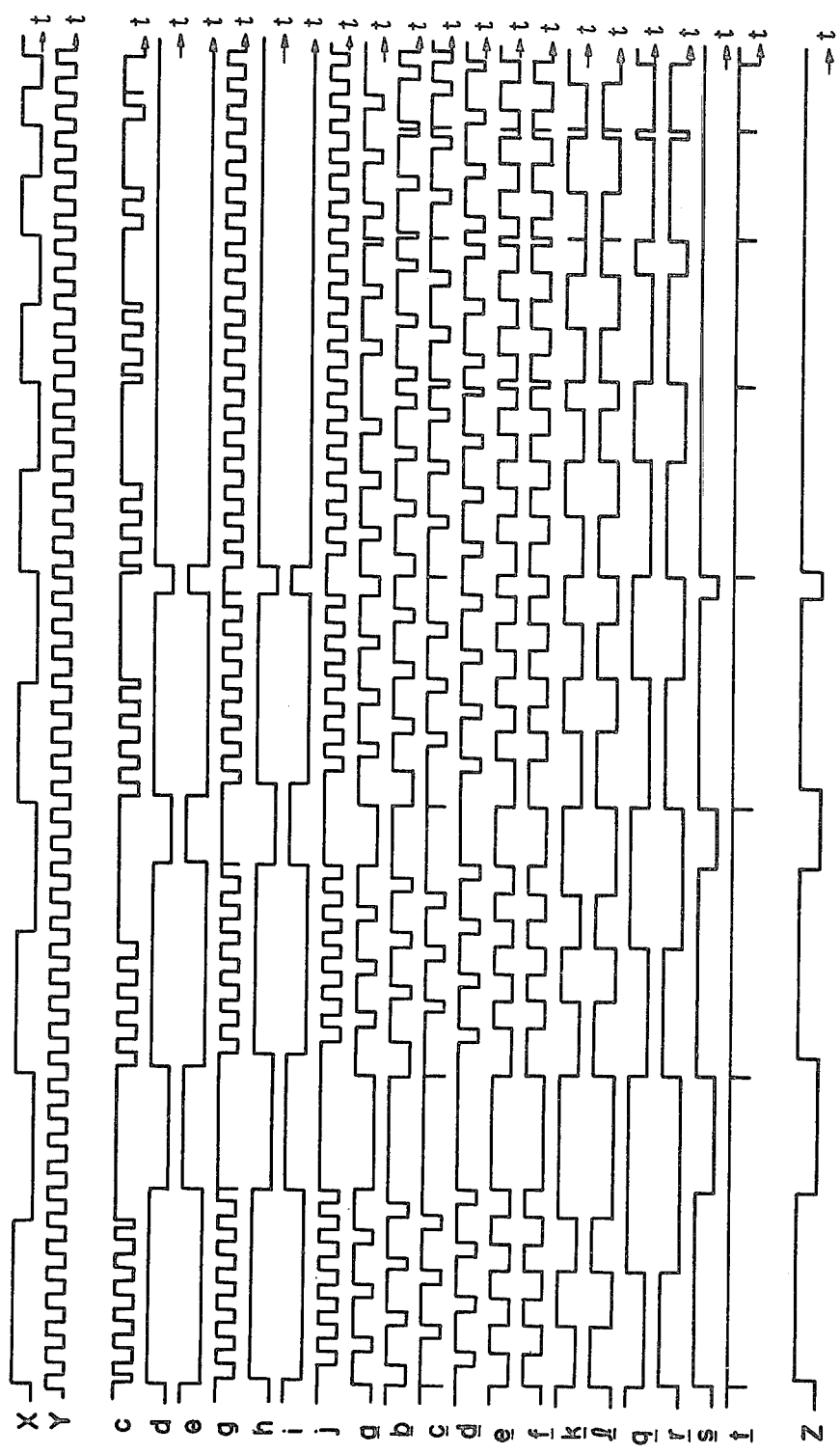
FIG. 7 is a signal waveform diagram of various parts for an explanation of the circuit function of FIG. 6.

In the circuit shown in FIG. 6, since 3 pairs of T-FFs, formed by 6 NAND gates respectively, are well known structures, detailed explanation on the function is not given here. When the signal wave, shown in curve t of FIG. 7, is applied to the input terminal $2a$ of the NAND gate a, the input terminal $2b$ of the NAND gate b, the input terminal $1e$ of the NAND gate e, the input terminal $1k$ of the NAND gate k and the input terminal $1q$ of the NAND gate q, and also, the signal wave, shown in curve j of FIG. 7, is applied to an input terminal $3a$ of the NAND gate a and an input terminal $3b$ of the NAND gate b, then the changes of the output signal level of the NAND gates a, b, c, d, e, f, k, l, q and r are as shown by curves a, b, c, d, e, f, k, l, q and r of FIG. 7, respectively.

On the other hand, NAND gates t, u, w and x, and inverter v form a trigger pulse generating circuit of negative direction, and its function is as follows.

First, when the voltage applied to the input terminal $1t$ of the NAND gate t and the input terminal $1v$ of the inverter v is at L level, the output level of each NAND gate is determined uniquely, for the NAND gate t H, for the NAND gate w H, for the NAND gate u L and for the NAND gate x H.

That means, the level at the output terminal $0t$ of the NAND gate t becomes H, since the level of the input terminal $1t$ is L. When the level of the NAND gate u is H, that is, the level of its output terminal $C_u$ is H, the level of its input terminal $2_u$ must be L. In order that the level of the input terminal $2_u$ of the NAND gate u is L, the level of the output terminal $0_x$ of the NAND gate x needs to be L. This means that the level of the input terminal $2_x$ of the NAND gate x needs to be H. In order that the level of the input terminal $2_x$ of the NAND gate x is H, the level of the input terminal $2_w$ of the NAND gate w must be L.

The level at the input terminal $2_w$ of the NAND gate w is H, since the level at the input terminal $1_v$ of the inverter v is L. That is, when the level at the input terminal $1_v$ is L, the level at the output terminal $0_u$ of the NAND gate u can not be H, but is surely L.

When the levels at the input terminals $1_t$ and $1_v$ suddenly turn from L to H, the level at the output terminal $0_t$ of the NAND gate t turns from H to L, since the level at the input $2_t$ of the NAND gate t is H, and hence, the level at the output terminal $0_u$ of the NAND gate u turns from L to H.

Accordingly, the level at the input terminal $1_x$ of the NAND gate x turns from L to H and the level at the output terminal $0_x$ of the NAND gate x turns from H to L, then the level at the output terminal $0_t$ of the NAND gate t goes back to H. These action lasts for only a short time and the level at the output terminal $0_t$ of the NAND gate t turns from H to l for a quite short time, at the moment when the input signal level turns from L to H.

While the levels at the input terminals $1_t$ and $1_v$ hold H, the levels at the output terminal $0_w$ of the NAND gate w is H, at the output terminal $0_u$ of the NAND gate u H and at the output terminal $0_x$ of the NAND gate x L. At the moment when the levels at the input terminals $1_t$ and $1_v$ suddenly turn from H to L, the level at the output terminal $0_w$ of the NAND gate w turns from H to L, since the level at the input terminal $1_w$ of the NAND gate w has changed to H. Accordingly, the level at the output terminal $0_x$ of the NAND gate x rises from L to H. At this time, the level at the output terminal $0_t$ of the NAND gate t turns from H to L for quite a short time.

While the levels at the input terminals $1_t$ and $1_v$ hold L, as described above, the level at the output terminal $0_t$ of the NAND gate t is H, the level at the output terminal $0_w$ of the NAND gate w is H, the level at the output terminal $0_u$ of the NAND gate u is L and the level at the output terminal $0_x$ of the NAND gate x is H.

After this time, every time when the levels at the input terminals $1_t$ and $1_v$ turn from L to H, or from H to L, they repeat same operational function. When the levels at the input terminals $1_t$ and $1_v$ change as shown in curve j of FIG. 7, the level at the output terminal $0_t$ of the NAND gate t becomes as shown by curve t of FIG. 7. That is, as the positive change of the input signal, a negative trigger pulse is generated at the output terminal $0_t$ of the NAND gate t.

When the signal wave, as shown in FIG. 7, is applied to the input terminals X and Y, first the NAND gate t generates the negaive trigger pulse, i.e. a reset pulse, as the level of the applied signal level at the terminal X changes from L to H. This makes the output levels of the NAND gates a, b, e, k and q H, so the output level of the NAND gate s also becomes H.

Accordingly, the output signal of the waveform of opposite polarity to that applied to the input terminal Y, i.e.l the input terminal $3_c$ of the NAND gate c, comes out at the output terminal $0_c$ of the NAND gate c while the levels at the input terminal $1_c$ and $2_c$ hold H.

Since the output level of the NAND gate s becomes L before the signal level at the input terminal X changes from L to H, the output levels of the NAND gate e and NAND gate i are H, and the output levels of the NAND gate d and NAND gate h are L.

At the moment when the output level of the NAND gate c turns from H to L, the output level of the NAND gate d turns from L to h and the output level of the NAND gate e oppositely turns from H to L. After the moment when the output level of the NAND gate d becomes H, the signal with the same waveform as that applied tpo the input terminal Y, comes out at the output terminal $0_g$ of the NAND gate g.

At the moment when the output level of the NAND gate g turns from h to L, the output level of the NAND gate h turns from L to h and the output level of the NAND gate i oppositely turns from h to L. After the moment when the output level of the NAND gate h, the output signal of the waveform of opposite polarity to that applied to the input terminal Y comes out at the output terminal $0_j$ of the NAND gate j. In this way, the output level of the NAND gates c, d, e, g, h, i and j change as shown by the curves c, d, e, g, h, i and j of FIG. 7.

When a signal of the curve j of FIG. 7 is applied to the input terminal of the first-stage T-FF and also a signal of curve t of FIG. 7 is applied to the signal input line for reset, the output levels of NAND gates a, b, c, d, e, f, k, l, q and r, which form a flip-flop (F-F), change as shown by the curves a, b, c, d, e, f, k, l, q and r of FIG. 7, respectively. At the moment when the output level of the NAND gate a becomes L, the output level of the NAND gate k H and the output level of the NAND gate q H, then, the output level of the NAND gate s turns from H to L, thereby turning all output levels of the NAND gates c, e and i to H. Incidentially, when the signal level at the terminal X is already L before the output level of the NAND gate s becomes L, the output level of the NAND gate c becomes H at this time.

This condition holds until the F-F is reset by the NAND gate t, after changing the signal level at the terminal X from L to H.

Referring to the circuit in FIG. 6, when the signal levels at the terminal X and terminal Y change as shown by the curves X and Y of FIG. 7, the output signal of the waveform of opposite to that of the NAND gate i appears at the output terminal Z. Its signal waveform is shown by the curve Z of FIG. 7.

As seen from the signal waveform Z of FIG. 7, the output signal of the circuit, shown in FIG. 6, possesses an astable period corresponding to 7 cycles of the signal applied to the terminal Y, that is in one cycle of the signal applied to the terminal X. When the one-cycle period of the signal applied to the terminal X is shorter than the 7-cycle period of the signal applied to the terminal Y, then the signal level at the output terminal Z holds H.

The digital signal mixing circuit shown in FIG. 6 is used for mixing the 7-cycle signal of the applied signal at the terminal Y with one cycle signal of the applied signal at the terminal X.

In the practical example of FIG. 6, a counter circuit is formed by the NAND gate j, NAND gate a, NAND gate b, NAND gate c, NAND gate d, NAND gate e, NAND gate f, NAND gate g, NAND gate h, NAND gate i, NAND gate j, NAND gate k, NAND gate l, NAND gate m, NAND gate n, NAND gate o, NAND gate p, NAND gate q, NAND gate r, NAND gate t, NAND gate u, NAND gate w, NAND gate x and inverter v. A reset circuit is formed by the inverter y and NAND gate s.

The counter circuit includes a count reset circuit which resets a count output signal by generating a reset signal when the applied signal level at the terminal X turns from L to H. The count reset circuit is formed by the NAND gate t, NAND gate u, NAND gate w, NAND gate x and inverter v.

In the examples for the digital signal mixing circuit of the invention shown in FIG. 1, FIG. 5 and FIG. 6, the output signal obtained at the output terminal Z has an astable period corresponding to any number of cycles of the applied signal at the terminal Y during one cycle of the applied signal at the terminal X.

If the connection point, from which the output signal is taken out, is changed, it is possible to obtain a signal waveform, so called a tone burst waveform, i.e. an output signal with any number of cycles of the applied signal at the terminal Y in one cycle of the applied signal at the terminal X. In the digital signal mixing circuit of FIG. 6, the output signals shown by the curves g and j of FIG. 7 are available, by taking them out from the output terminal of the NAND gate g or NAND gate j.

In the digital signal mixing circuit of the invention of FIG. 6, the number of cycles of the applied signal at the terminal Y in one cycle of the applied signal at the terminal X, is freely controllable, by changing the number of stages of the T-FFs constituting the counter circuit or by changing a connection point of the input terminal of the NAND gate s for the reset circuit.

Figure 8:
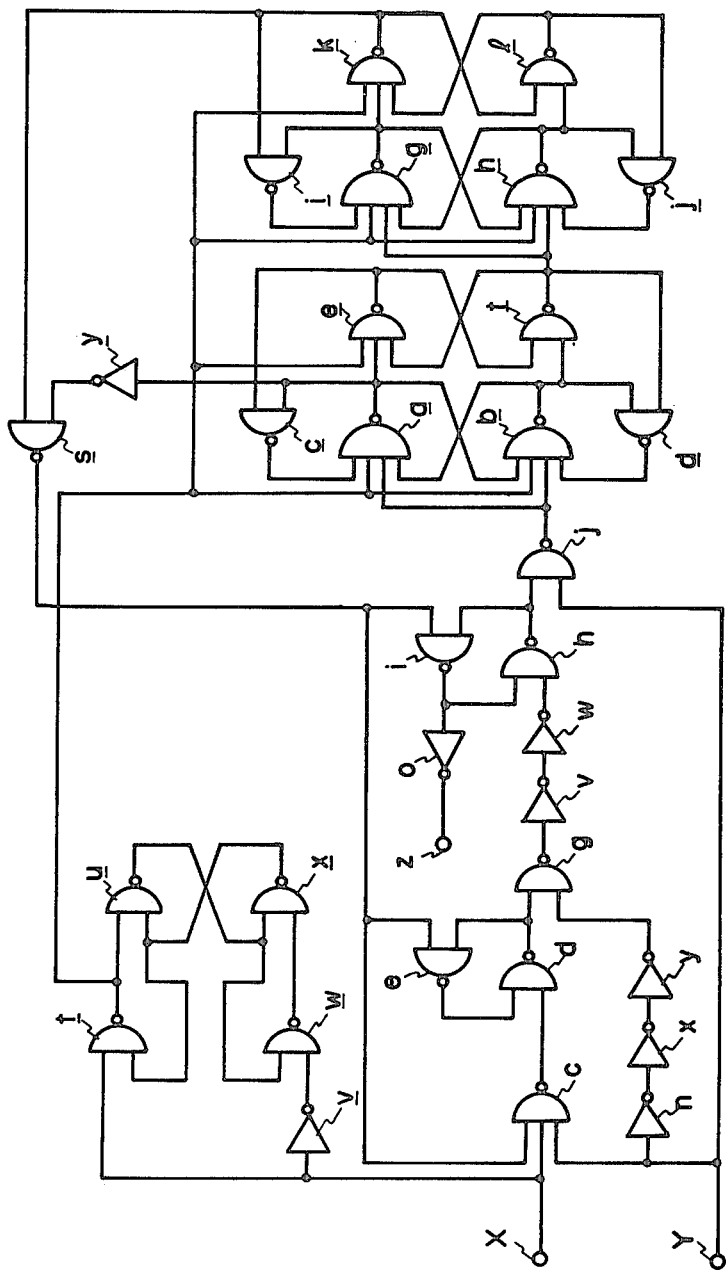
FIG. 8 and FIG. 9 are circuit diagrams of digital signal mixing circuits of another practical examples of the invention.

A digital signal mixing circuit of FIG. 8 with two stages of T-FFs can mix a three-cycle signal of an applied signal at a terminal Y with a one-cycle signal of the applied signal at a terminal X.

In the practical examples of FIG. 1, FIG. 4, FIG. 5, FIG. 6 and FIG. 8, all of them have two bistable circuits.

The 1st bistable circuit is formed by three NAND gates. The signal of same polarity to that applied to the input terminal X is applied to one input terminal of the first NAND gate c. The signal of same polarity to that applied to the inut terminal Y is applied to another input terminal of the first NAND gate c. The output signal of the first NAND gate c is applied to one input terminal of the second NAND gate d. The output signal of the second NAND gate d is applied to one input terminal of the third NAND gate e. The reset signal from the reset circuit is applied to the other input terminal of the third NAND gate e. The output signal of the third NAND gate e is applied to the other input terminal of the second NAND gate d.

The 2nd bistable circuit is formed by four NAND gates. The output signal of the second NAND gate d is applied to one input terminal of the fourth NAND gate g. The signal of opposite polarity to that applied to the terminal Y is applied to the other input terminal of the fourth NAND gate g. The output signal of the fourth NAND gate g is applied to one input terminal of the fifth NAND gate h. The output signal of the fifth NAND gate h is applied to one input terminal of the sixth NAND gate i. The reset signal from the reset circuit is applied to the other input terminal of the sixth NAND gate i. The output signal of the sixth NAND gate i is applied to the other inut terminal of the fifth NAND gate h.

In the practical example of FIG. 8, two inverters v and w are connected between an output terminal of the fourth NAND gate g and one of the input terminals of the fifth NAND gate h, and three inverters n, x and y are connected between the terminal Y and one of the input terminals of the fourth NAND gate g.

By comparing the circuit of FIG. 6 with that of FIG. 8, it seems as if the inverters v, w, x and y are not necessary, but they are necessary in order to compensate a time delay when the output signal turns from H to L.

If these inverters are not added to the circuits of FIG. 1, FIG. 4, FIG. 5, FIG. 6 and FIG. 8, a time delay for the output signal turning from L to H is shorter than the time delay for the output signal turning from H to L, so that the additional inverters are added at the input side of the fifth NAND gate h for the output signal turning from L to H, to make this time difference smaller. This leads to the increase of the time delay for the output signal turning from L to H.

The above-mentioned effect in more effective for the part nearest to the fifth NAND gate h, i.e. for the output terminal of the fourth NAND gate g and for the input terminal of the fifth NAND gate h than for the inut terminal of the fourth NAND gate g. By adding an appropriate number of inverters it is possible to equalized two time delays namely the time delay for the change from L to H and the time delay for the change from H to L.

The number of the inverters connected between the output terminal of the fourth NAND gate g and the input terminal of the fifth NAND gate h, is even. If several buffers ar used, the number can be either even or odd. The number of inverters connected between the terminal Y and the input side of the fourth NAND gate g, is odd. Odd number of inverters and a certain number of buffers will also do.

In the practical examples of the invention shown in FIG. 1, FIG. 4, FIG. 5, FIG. 6 and FIG. 8, the first bistable circuit, the second bistable circuit and the counter circuit are formed by using NAND gates. It is also possible to form the bistable circuits with a usual transistor circuit.

Figure 9:
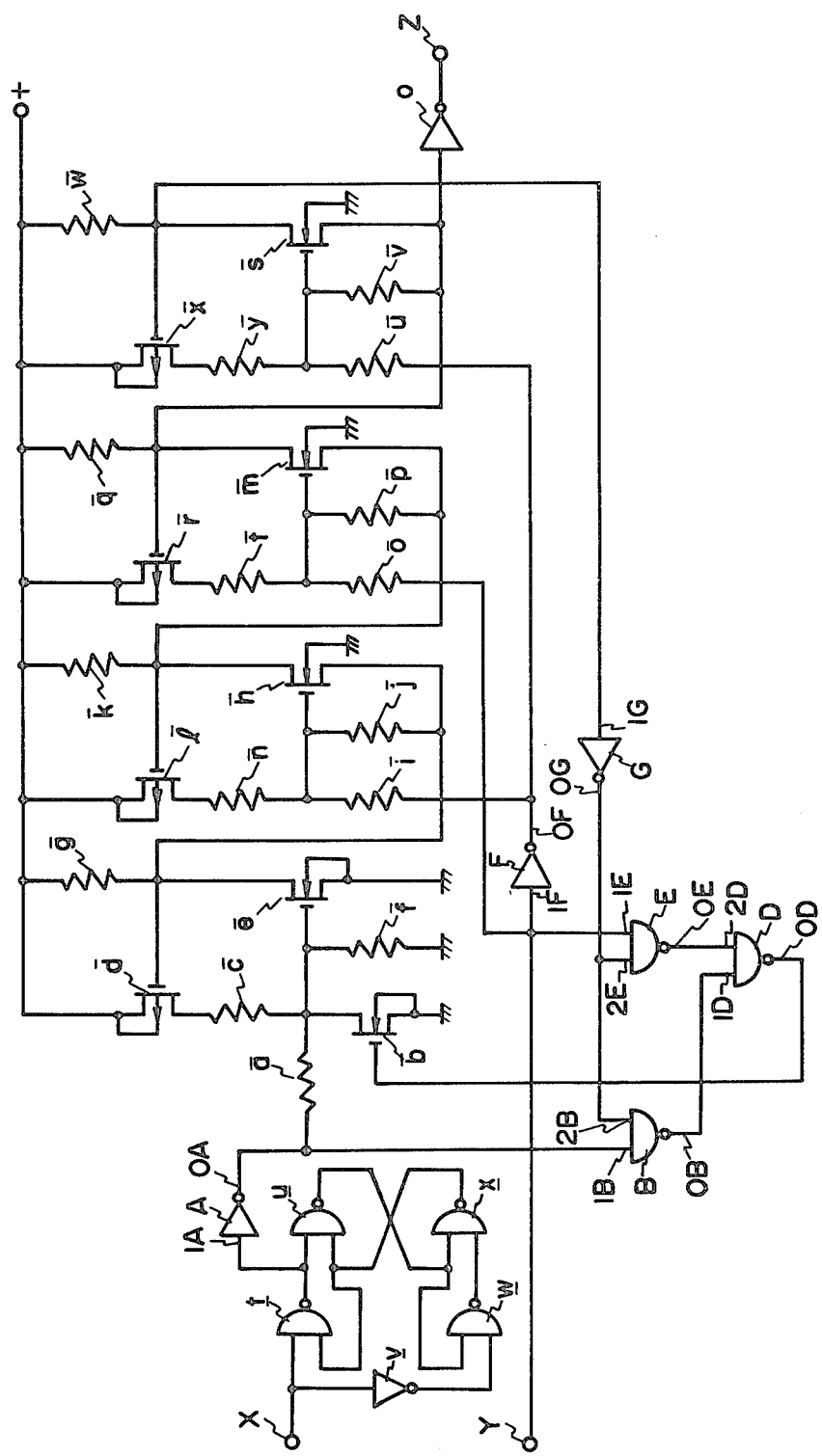

FIG. 9 shows a first bistable circuit, a second bistable circuit and a counter circuit with the conventional transistor circuits. An output terminal of a NAND gate t, which generates a negative trigger pulse, is connected to an input terminal 1A of an inverter A. An output terminal 0A of the inverter A is connected to an input terminal 1B of a NAND gate B and to the drain of an N-channel enhancement-type MOS transistor $\bar{b}$ through a resistor $\bar{a}$. An output terminal 0B of the NAND gate B is connected to a input terminal 1D of a NAND gate D.

An output terminal OD of the NAND gate D is connected to the gate of the N-channel enhancement-type MOS transistor $\bar{b}$. The source of the N-channel enhancement-type MOS transistor $\bar{b}$ is grounded (the earth point is connected to the minus-voltage supplying line). The drain of the transistor $\bar{b}$ is connected to the drain of a P-channel enhancement-type MOS transistor $\bar{d}$ through a resistor $\bar{c}$ and to the gate of an N-channel enhancement-type MOS transistor $\bar{e}$.

A resistor $\bar{f}$ is connected between the gate and source of the N-channel enhancement-type MOS transistor $\bar{e}$, and its source is grounded. And the drain hereof is connected to the plus-voltage supplying line through a resistor $\bar{g}$, to the gate of the P-channel enhancement-type MOS transistor $\bar{d}$ and to the source of an N-channel enhancement-type MOS transistor $\bar{h}$.

A terminal Y is connected to a input terminal 1E of a NAND gate E and an input terminal 1F of an inverter F. An output terminal 0E of the NAND gate E is connected to an input terminal 2D of the NAND gate D. An output terminal 0F of the inverter F is connected to the gate of the N-channel enhancement-type MOS transistor $\bar{h}$ through a resistor $\bar{i}$. A resistor $\bar{j}$ is connected between the gate and source of the N-channel enhancement-type MOS transistor $\bar{h}$. And the drain thereof is connected to the plus-voltage supplying line through a resistor $\bar{k}$, to the gate of a P-channel enhancement-type MOS transistor $\bar{l}$ and to the source of an N-channel enhancement-type MOS transistor $\bar{m}$. The drain of the P-channel enhancement-type MOS transistor $\bar{l}$ is connected to the gate of the N-channel enhancement-type MOS transistor $\bar{h}$ through a resistor $\bar{n}$.

The terminal Y is connected to the gate of the N-channel enhancement-type MOS transistor $\bar{m}$ through a resistor $\bar{o}$. A resistor $\bar{p}$ is connected between the gate and source of the N-channel enhancement-type MOS transistor $\bar{m}$. The drain hereof is connected to the plus-voltage supplying line through a resistor $\bar{q}$, to the gate of a P-channel enhancement-type MOS transistor $\bar{r}$ and to the source of an N-channel enhancement-type MOS transistor $\bar{s}$. The drain of the P-channel enhancement-type MOS transistor $\bar{r}$ is connected to the gate of the N-channel enhancement-type MOS transistor $\bar{m}$ through a resistor $\bar{t}$.

The output terminal OF of the inverter F is connected to the gate of the N-channel enhancement-type MOS transistor $\bar{s}$ through a resistor $\bar{u}$. A resistor $\bar{v}$ is connected between the gate and source of the N-channel enhancement-type MOS transistor $\bar{s}$. The drin thereof is connected to the plus-voltage supplying line through a resistor $\bar{w}$, to the gate of a p-channel enhancement-type MOS transistor $\bar{x}$ and to an input terminal 1G of an inverter G. The drain of the P-channel enhancement-type MOS transistor $\bar{x}$ is connected to the gate of the N-channel enhancement-type MOS transistor $\bar{s}$ through a resistor $\bar{y}$. An output terminal OG of the inverter G is connected to an input terminal 2B of the NAND gate B and an input terminal 2E of the NAND gate E.

The sources of the P-channel enhancement-type MOS transistors $\bar{d}$, $\bar{l}$, $\bar{r}$ and $\bar{x}$ are connected to the plus-voltage supplying line. The drain of the N-channel enhancement-type MOS transistor $\bar{m}$ is connected to an output terminal Z through an inverter o.

Figure 10:
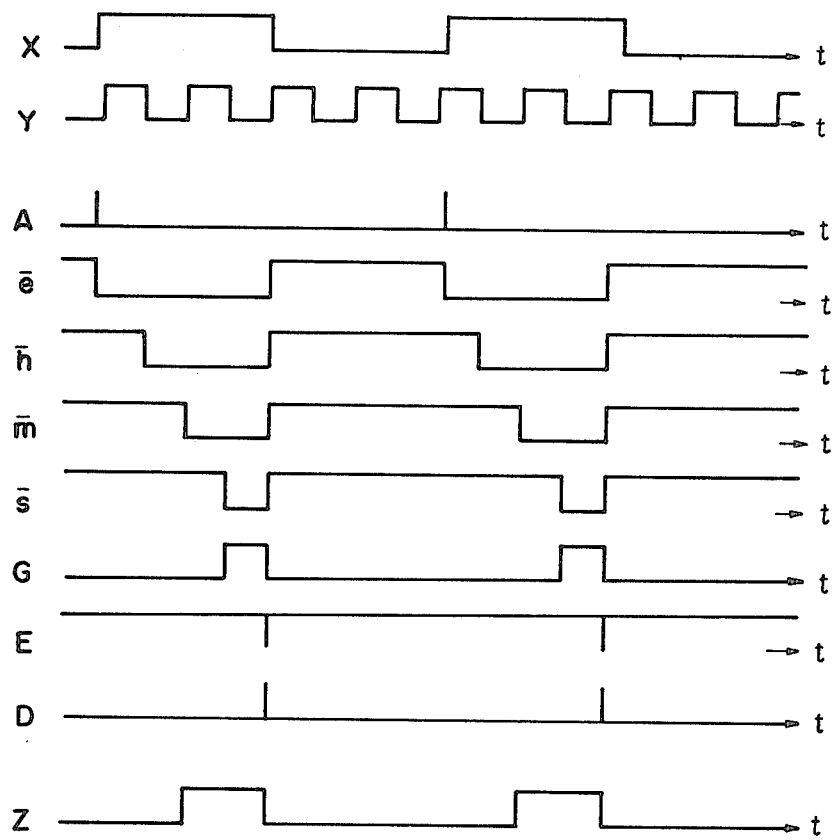
FIG. 10 is a signal waveform diagram of various parts of the circuit of FIG. 9.

An explanation for the digital signal mixing circuit of FIG. 9 is given below. When the signals shown by the curves X and Y of FIG. 10 are applied to the terminals X and Y, a signal shown by a curve A of FIG. 10 comes out at the output terminal OA of the inverter A. Known "hook-combination switch" circuits, each consisting of complementary pair of switching transistors, are formed by the P-channel enhancement-type MOS transistor d and N-channel enhancement-type MOS transistor $\bar{e}$, the P-channel enhancement-type MOS transistor $\bar{l}$ and N-channel enhancement-type MOS transistor $\bar{h}$, P-channel enhancement-type MOS transistor $\bar{r}$ and N-channel enhancement-type MOS transistor $\bar{m}$, P-channel enhancement-type MOS transistor $\bar{x}$ and N-channel enhancement-type MOS transistor $\bar{s}$, respectively. They form bistable circuits having two stable states of on- and off-states including the resistors.

When a positive trigger pulse shown by the curve A of FIG. 10 is applied to the first bistable circuit formed by the P-channel enhancement-type MOS transistor $\bar{d}$, N-channel enhancement-type MOS transistor $\bar{e}$, resistors, $\bar{a}$, $\bar{c}$, $\bar{f}$ and $\bar{g}$, both states of the P-channel enhancement-type MOS transistor $\bar{d}$ and N-channel enhancement-type MOS transistor $\bar{e}$ shift from off- to on-state. And the voltage is ready to be supplied to the second bistable circuit formed by the P-channel enhancement-type MOS transistor $\bar{l}$, N-channel enhancement-type MOS transistor $\bar{h}$, resistors $\bar{i}$, $\bar{n}$, $\bar{j}$, and $\bar{k}$ and inverter F.

When the applied signal level at the terminal Y turns from H to L, the output level of the inverter F turns from L to H. Then both states of the P-channel enhancement-type MOS transistor $\bar{l}$ and N-channel enhancement-type MOS transistor $\bar{h}$ shift from off- to on-state. And the voltage is ready to be supplied to the third bistable circuit formed by the P-channel enhancement-type MOS transistor $\bar{r}$, N-channel enhancement-type MOS transistor $\bar{m}$, resistors, $\bar{o}$, $\bar{t}$, $\bar{p}$ and $\bar{q}$. Thereafter, when the applied signal level at the terminal Y turns from LL to H, both states of the P-channel enhancement-type MOS transistor $\bar{r}$ and N-channel enhancement-type MOS transistor $\bar{m}$ shift from off- to on-state. And the voltage is ready to be supplied to the fourth bistable circuit formed by the P-channel enhancement-type MOS transistor $\bar{x}$, N-channel enhancement-type MOS transistor $\bar{s}$, resistors $\bar{u}$, $\bar{y}$, $\bar{v}$ and $\bar{w}$, and inverter F.

When the applied signal level at the terminal Y turns from H to L, the output level of the inverter F turns from L to H. Then both states of the P-channel enhancement-type MOS transistor $\bar{x}$ and N-channel enhancement-type MOS transistor $\bar{s}$ shift from off- to on-state, and the output level of the inverter G becomes H.

Thereafter, when the applied signal level at the terminal Y turns from L to H, the output level of the NAND gate E turns from H to L. And hence the N-channel enhancement-type MOS transistor $\bar{b}$ enters into the on-state, since the output level of the NAND gate D becomes H. The first bistable circuit is reset, and hence the second bistable circuit, third bistable circuit and fourth bistable circuit are reset.

As explained above, in the digital signal mixing circuit of FIG. 9, when the signal shown by the curves X and Y of FIG. 10 is applied to the terminal X and terminal Y, the signal waveforms shown by the curves A, $\bar{e}$, $\bar{h}$, $\bar{m}$, $\bar{s}$, G, E, D and Z of FIG. 10 come out at the output terminal OA of the inverter A, the drain of the N-channel enhancement-type MOS transistor $\bar{e}$, the drain of the N-channel enhancement-type MOS transistor $\bar{h}$, N-channel enhancement-type MOS transistor $\bar{m}$, the drain of the N-channel enhancement-type MOS transistor $\bar{s}$, the output terminal OG of the inverter G, the output terminal CE of the NAND gate E, the output terminal OD of the NAND gate D and the output terminal of the inverter O (the output terminal Z) respectively.

As seen from the signal waveforms shown by the curves X, Y and Z of FIG. 10, the digital signal mixing circuit of FIG. 9 and that of FIG. 1 function in the same manner. The NAND gate B of FIG. 9 and the NAND gate f of FIG. 1 function in the same manner.

In FIG. 1, the first bistable circuit is formed by the NAND gate c, NAND gate d and NAND gate e a functions to change the state from the first stable to the second stable state when the applied signal level at the terminal X becomes H and the applied signal level at the terminal Y becomes H. In the circuit of FIG. 9, such function is served by the second bistable circuit which is formed by the P-channel enhancement-type MOS transistor 1, N-channel enhancement-type MOS transistor h, resistors i, n, j and k, and inverter F. In FIG. 1, the second bistable circuit is formed by the NAND gate g, NAND gate h, NAND gate i and inverter n, and functions to change the state from the first stable to the second stable state when the first bistable circuit changes its state to the second stable state and the applied signal level at the terminal Y becomes L. In the circuit of FIG. 9, this function is served by the third bistable circuit which is formed by the P-channel enhancement-type MOS transistor $\bar{r}$, N-channel enhancement-type MOS transistor $\bar{m}$, resistors $\bar{o}$, $\bar{t}$, $\bar{p}$ and $\bar{q}$.

The bistable circuit of FIG. 9 is formed by the enhancement-type MOS transistors and resistors, and this practical circuit example is possible to form with the usual bipolar transistors, thyristors, etc.

Figure 11:
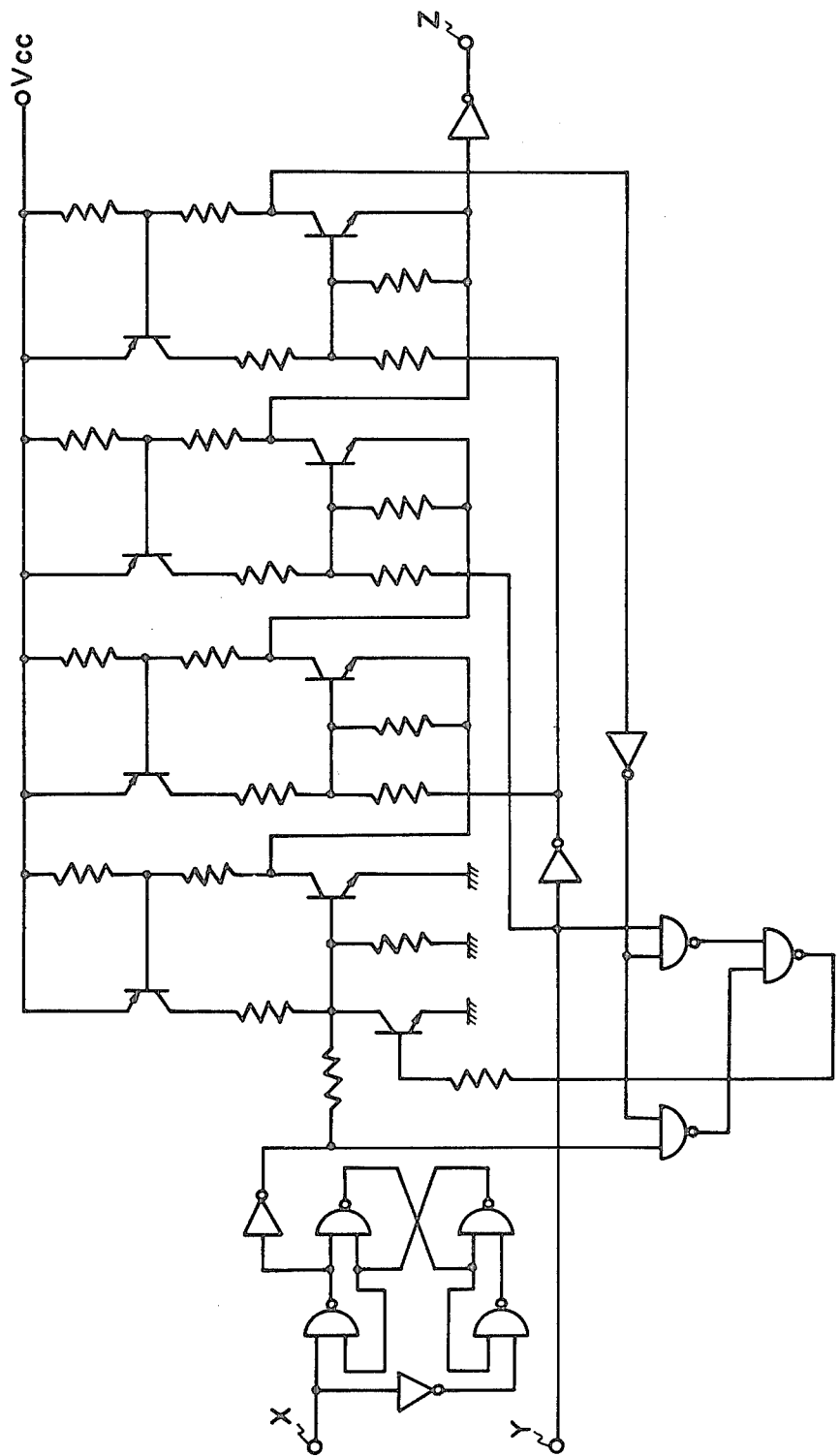
FIG. 11, FIG. 12, FIG. 13 and FIG. 14 are circuit diagrams for digital signal mixing circuits of other practical examples of the invention.

FIG. 11 is one example of the digital signal mixing circuit of the invention with the usual bipolar transistors. A detailed explanation of the function and signal waveforms is not given here, since they are quite same as the ones for the circuit of FIG. 9.

Digital signal mixing circuits of the invention shown in FIG. 1, FIG. 4, FIG. 5, FIG. 6, FIG. 8, FIG. 9 and FIG. 11, have two input terminals X and Y, the first bistable circuit and second bistable circuit. The state of the first bistable circuit changes from the first stable to the second stable state when the applied signal level at the terminal X becomes H and the applied signal level at the terminal Y becomes H.

The state of the second bistable circuit changes from the first stable to second stable state when the state of the first bistable circuit shifts to the second stable state and the applied signal level at the terminal Y becomes L.

The digital signal mixing circuit of the present invention can provide the possibility to change the input condition for the states of the first bistable and second bistable circuits, by interchanging the constitution of the input part of the circuit.

Figure 12:
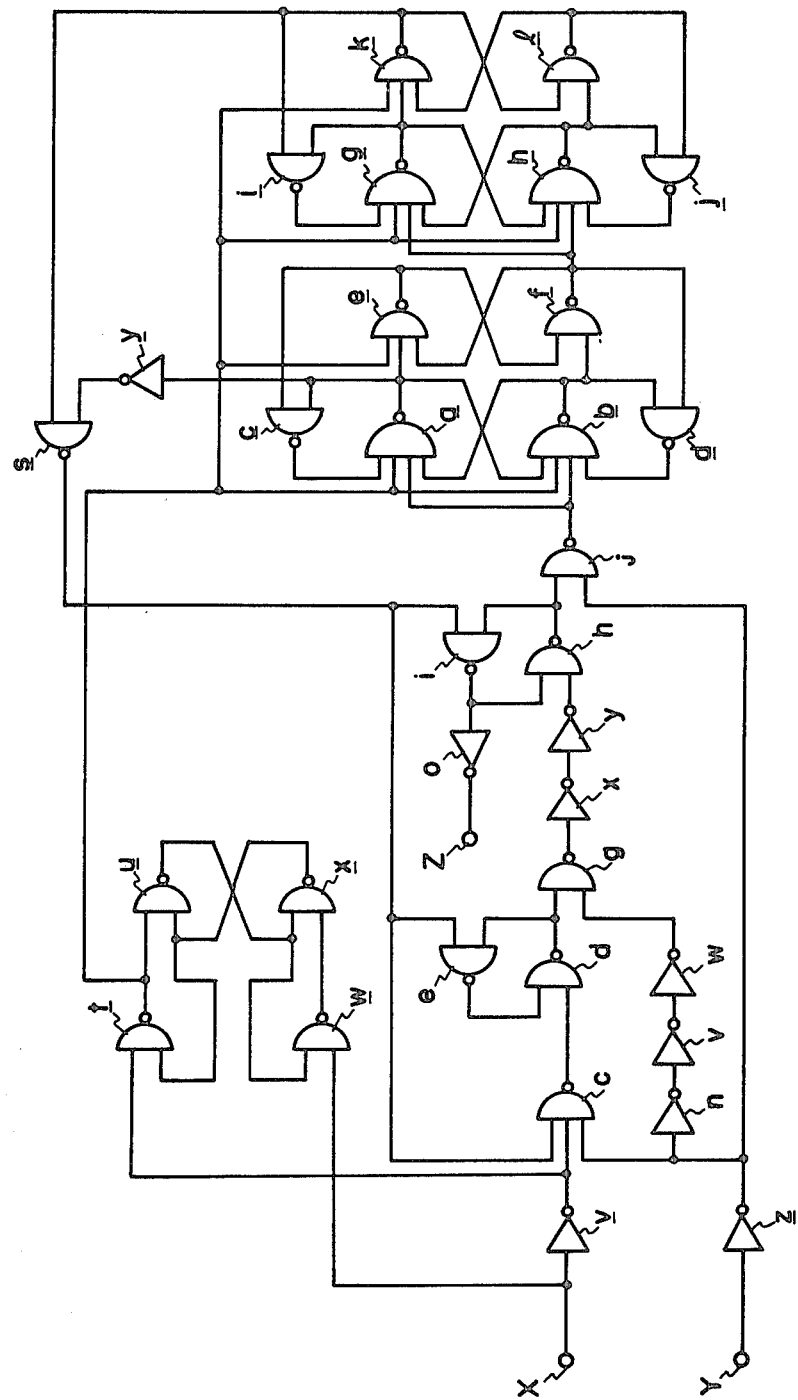

A digital signal mixing circuit of the invention shown in FIG. 12 has two input terminals X and Y, a first bistable circit, a second bistable circuit, a counter circuit and a reset circuit.

The first bistable circuit formed by a NAND gate c, NAND gate d, NAND gate e and inverter z changes its state from a first stable to second stable state when an applied signal level at a terminal X becomes L and an applied signal level at a terminal Y becomes L.

The second bistable circuit formed by a NAND gate g, NAND gate h, NAND gate i, inverter z, inverter n, inverter v, inverter w, inverter x and inverter y changes its state from a first stable is second stable state, when the state of the first bistable circuit enters into the second stable state and the applied signal level at the terminal Y becomes H.

The counter circuit formed by a NAND gate j, NAND gate a, NAND gate b, NAND gate c, NAND gate d, NAND gate e, NAND gate f, NAND gate g, NAND gate h, NAND gate i, NAND gate j, NAND gate k, NAND gate l, NAND gate t, NAND gate u, NAND gate w, NAND gate x and inverter v counts the number of cycles of the applied signal at the terminal Y, after the second bistable circuit enters into the second stable state.

The reset circuit formed by a NAND gate s and inverter y resets the first and second bistable circuits to the first stable state, when the output signal of the counter circuit reaches at a target value.

The counter circuit has a count reset circuit formed by the NAND gate t, NAND gate u, NAND gate w, NAND gate x and inverter v. The count reset circuit resets the output signal of the counter and generates a reset signal when the applied signal level at the terminal X turns from H to L.

In the first bistable circuit, a signal of opposite polarity to the applied signal at the terminal X, is applied to one input terminal of the first NAND gate c, and the signal of opposite polarity to the applied signal at the terminal Y is applied to another input terminal of the first NAND gate c. The output signal of the first NAND gate c is applied to one input terminal of the second NAND gate d. The output signal of the second NAND gate d is applied to one input terminal of the third NAND gate e and a reset signal from the reset circuit is applied to the other input terminal of the third NAND gate e. The output signal of the third NAND gate e is applied to the other input terminal of the second NAND gate d.

In the second bistable circuit, the output signal of the second NAND gate d is applied to one input terminal of the NAND gate g and the signal of same polarity as the applied signal at the terminal Y (non-inverted signal) is applied to the other input terminal of the fourth NAND gate g. The output signal of the fourth NAND gate g is applied to one input terminal of the fifth NAND gate h. The output signal of the fifth NAND gate h is applied to one input terminal of the sixth NAND gate i. The reset signal of the reset circuit is applied to the other input terminal of the sixth NAND gate i. The output signal of the sixth NAND gate i is applied to the other input terminal of the fifth NAND gate h.

Two inverters are connected between the output terminal of the fourth NAND gate g and one input terminal of the fifth NAND gate h. Four inverters are connected between the terminal Y and the other input terminal of the fourth NAND gate g.

These inverters except the inverters z and n are used for compensating a time delay of the circuit, same as the circuit of FIG. 8. The number of the inverters connected between the output terminal of the fourth NAND gate g and the one input terminal of the fifth NAND gate h is even. If the buffers are employed, the number can be either even or odd. On the other hand, the number of the inverters connected between the terminal Y and the other input terminal of the fourth NAND gate is also even, and if the buffers are employed, the number can be either even or odd.

Figure 13:
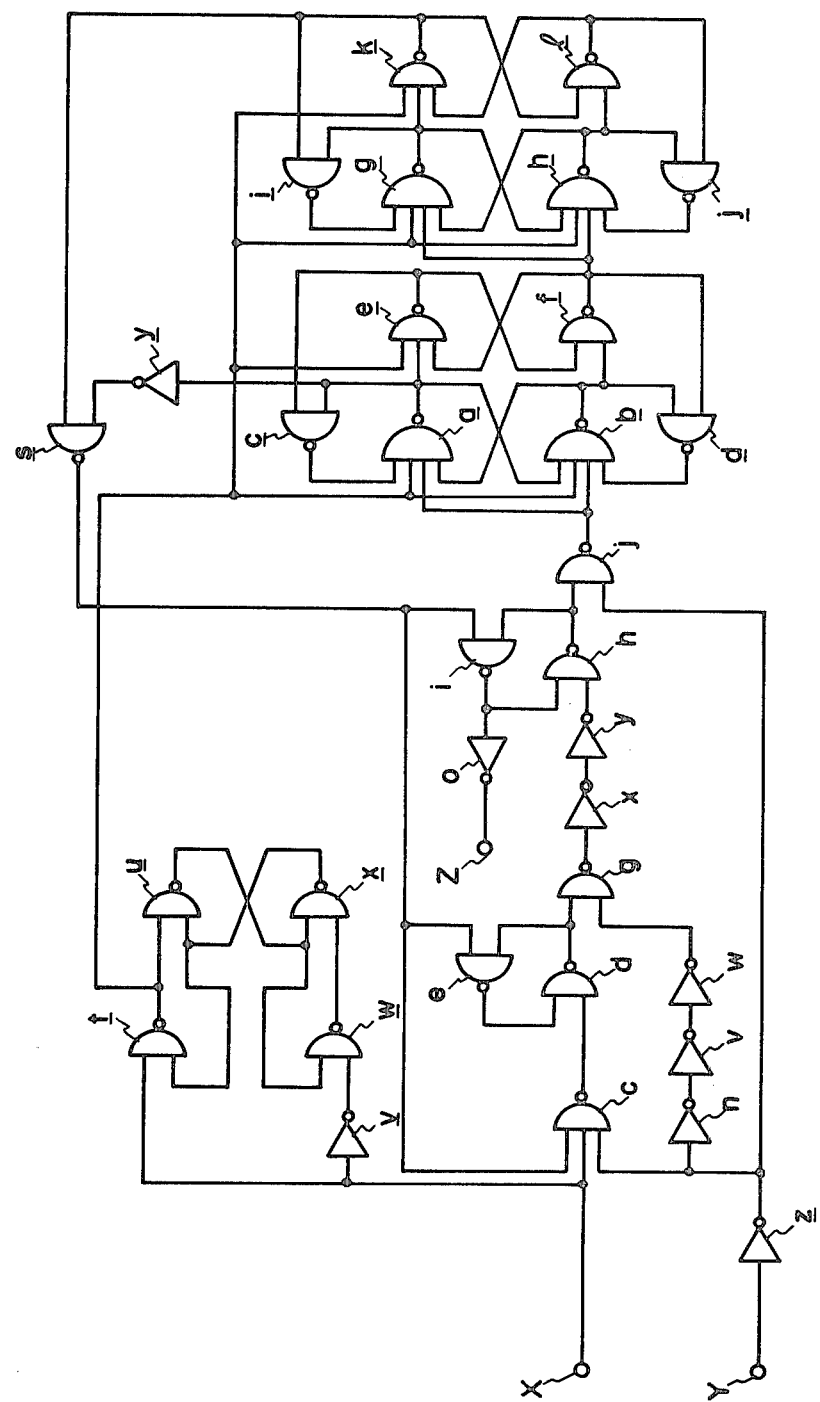

A digital signal mixing circuit of the invention of FIG. 13 has two input terminals X and Y, a first bistable circuit, a second bistable circuit, a counter circuit and a reset circuit.

The first bistable circuit changes its state from a first stable to second stable state when an applied signal level at a terminal X becomes H and an applied signal level at a terminal Y becomes L.

The second bistable circuit changes its state from a third stable to second stable state when the state of the first bistable circuit enters into the second stable state and the applied signal level at the terminal Y becomes H.

The counter circuit counts the number of cycles of the applied signal at the terminal Y after the second bistable circuit enters into the second stable state.

The reset circuit resets the first and second bistable circuits to the first stable state when the output signal of the counter circuit reaches at a target value.

The first bistable circuit is formed by a NAND gate c, NAND gate d, NAND gate e and inverter z. The second bistable circuit is formed by a NAND gate g, NAND gate h, NAND gate i, inverter z, inverter n, inverter v, inverter w, inverter x and inverter y.

The counter circuit is formed by a NAND gate j, NAND gate a, NAND gate b, NAND gate c, NAND gate d, NAND gate e, NAND gate f, NAND gate g, NAND gate h, NAND gate i, NAND gate j, NAND gate k, NAND gate l, NAND gate t, NAND gate u, NAND gate w, NAND gate x and inverter v. The reset circuit is formed by a NAND gate s and inverter y.

The counter circuit has a count reset circuit formed by the NAND gate t, NAND gate u, NAND gate w, NAND gate x and inverter v. The count reset circuit resets the output signal of the counter and generates reset signal when the applied signal level at the terminal X turns from L to H.

In the first bistable circuit, a signal of same polarity as the applied signal at the terminal X, is applied to one input terminal of the first NAND gate c, and the signal of opposite polarity to the applied signal at the terminal Y is applied to another input terminal of the first NAND gate c. The output signa of the first NAND gate c is applied to one input terminal of the second NAND gate d. The output signal of the second NAND gate d is applied to one input terminal of the third NAND gate e and a reset signal from the reset circuit is applied to the other input terminal of the third NAND gate e. The output signal of the third NAND gate e is applied to the other input terminal of the second NAND gate d.

In the second bistable circuit, the output signal of the second NAND gate d is applied to one input terminal of the NAND gate g and the signal of same polarity as the applied signal at the terminal Y is applied to the other input terminal of the fourth NAND gate g. The output signal of the fourth NAND gate g is applied to one input terminal of the fifth NAND gate h. The output signal of the fifth NAND gate h is applied to one input terminal of the sixth NAND gate i. The reset signal of the reset circuit is applied to the other input terminal of the sixth NAND gate i. The output signal of the sixth NAND gate i is applied to the other input terminal of the fifth NAND gate h.

Two inverters are connected between the output terminal of the fourth NAND gate g and one input terminal of the fifth NAND gate h. Four inverters are connected between the terminal Y and the other input terminal of the fourth NAND gate g.

These inverters except the inverters z and n are used for compensating a time delay of the circuit, same as the circuit of FIG. 8. The number of the inverters connected between the output terminal of the fourth NAND gate g and the one input terminal of the fifth NAND gate h is even. If the buffers are employed, the number can be either even or odd. On the other hand, the number of the inverters connected between the terminal Y and the other input terminal of the fourth NAND gate g is also even, and if the buffers are employed, hthe number can be either even or odd.

Figure 14:
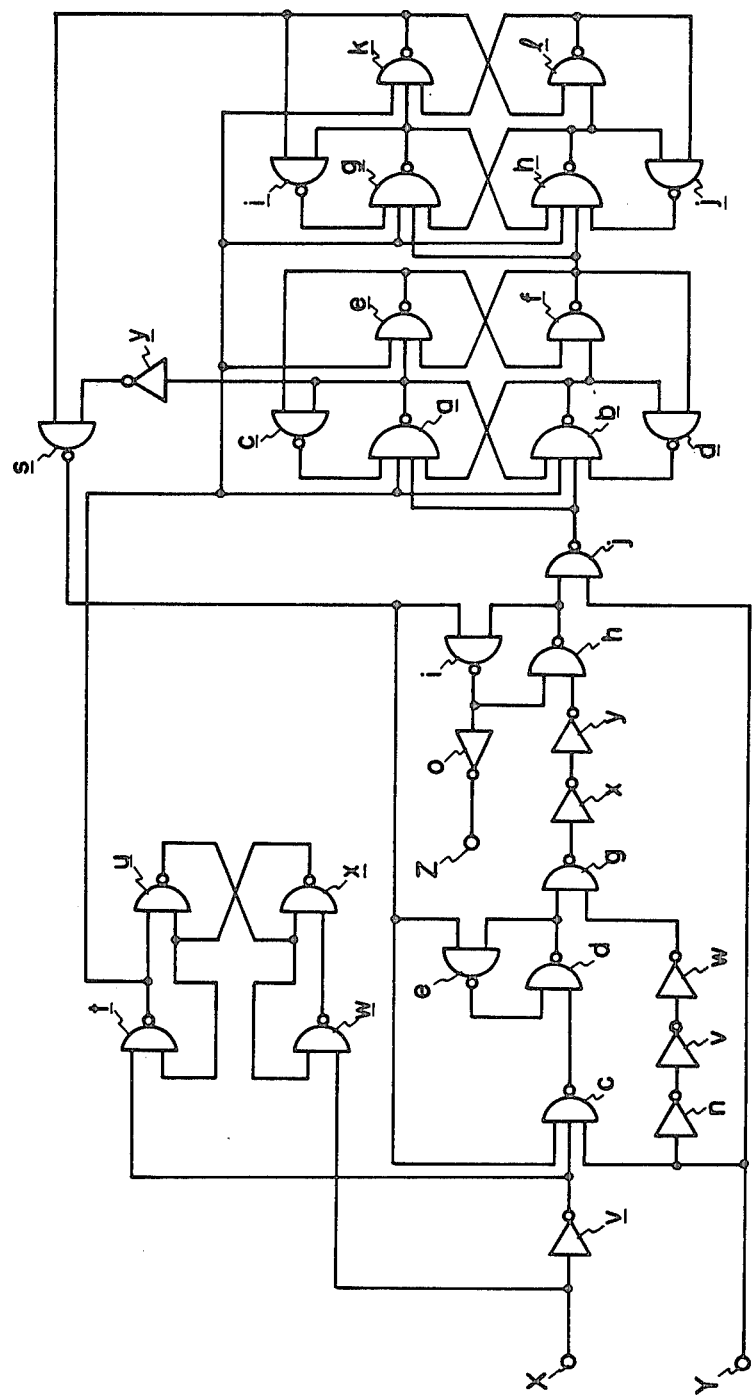

A digital signal mixing circuit of the invention of FIG. 14 has two input terminals X and Y, a first bistable circuit, a second bistable circuit, a counter circuit and a reset circuit.

The first bistable circuit changes its state from a first stable to second stable state when an applied signal level at the terminal X becomes L and an applied signal level at the terminal Y becomes H.

The second bistable circuit changes its state from a first stable to second stable state when the state of the first bistable circuit enters into the second stable state and the applied signal level at the terminal Y becomes L.

The counter circuit counts the number of cycles of the applied signal at the terminal Y after the second bistable circuit enters into the second stable state.

The reset circuit resets the first and second bistable circuits to the first stable state when the output signal of the counter circuit reaches at a target value.

The first bistable circuit is formed by a NAND gate c, NAND gate d, NAND gate e and inverter v. The second bistable circuit is formed by a NAND gate g, NAND gate h, NAND gate i, inverter n, inverter v, inverter w, inverter x and inverter y.

The counter circuit is formed by a NAND gate j, NAND gate a, NAND gate b, NAND gate c, NAND gate d, NAND gate e, NAND gate f, NAND gate g, NAND gate h, NAND gate i, NAND gate j, NAND gate k, NAND gate l, NAND gate t, NAND gate u, NAND gate w, NAND gate x and inverter v. The reset circuit is formed by a NAND gate s and inverter y.

In the first bistable circuit, a signal of opposite polarity to the applied signal at the terminal X, is applied to one input terminal of the first NAND gate c, and the signal of same polarity to the applied signal at the terminal Y is applied to another input terminal of the first NAND gate c.

A reset signal from the reset circuit is applied to the third input terminal of NAND gate c, and the output of gate c is supplied to an input terminal of the second NAND gate d. The output signal of the second NAND gate d is applied to one input terminal of the third NAND gate e and a reset signal from the reset circuit is applied to the other input terminal of the third NAND gate e. The output signal of the third NAND gate e is applied to the other input terminal of the second NAND gate d.

In the second bistable circuit, the output signal of the second NAND gate d is applied to one input terminal of the NAND gate g and the signal of opposite polarity to the applied signal at the terminal Y is applied to the other input terminal of the fourth NAND gate g. The output signal of the fourth NAND gate g is applied to one input terminal of the fifth NAND gate h. The output signal of the fifth NAND gate h is applied to one input terminal of the sixth NAND gate i. The reset signal of the reset circuit is applied to the other input terminal of the sixth NAND gate i. The output signal of the sixth NAND gate i is applied to the other input terminal of the fifth NAND gate h.

Two inverters are connected between the output terminal of the fourth NAND gate g and one input terminal of the fifth NAND gate h. Three inverters are connected between the terminal Y and the other input terminal of the fourth NAND gate g.

These inverters except the inverter n are used for compensating a time of the circuit, the same as the circuit of FIG. 8. The number of the inverters connected between the output terminal of the fourth NAND gate g and the one input terminal of the fifth NAND gate h is even. If the buffers are employed, the number can be either even or odd. On the other hand, the number of the inverters connected between the terminal Y and the other input terminal of the fourth NAND gate g is odd.

Another possibility is to use odd number of the inverters and some specified number of buffers.

Among the digital signal mixing circuits of the invention described above, except the example of FIG. 9 and the example of FIG. 11, the reset signal coming from the reset circuit is also directly applied to the second bistable circuit (the third bistable circuit for practical examples of FIG. 9 and FIG. 11). If the time delay of the reset function gives no problem, it is possible to reset the second bistable circuit indirectly by applying a reset signal to the first bistable circuit, without applying the reset signal to the second bistable circuit.

For example, in the mixing circuit of FIG. 6 if the output terminal 0d of the NAND gate d (one element of the first bistable circuit) is connected to the input terminal 1i of the NAND gate i (one element of the second bistable circuit), the reset signal from the reset circuit is applied to the input terminal 1i of the NAND gate i indirectly.

The digital signal mixing circuits of the invention explained above, can mix the different digital signals coming from different sources on a time base. This makes it possible to form a monostable circuit with high accuracy and tone burst wave generator circuit by applying a reference frequency signal from a crystal oscillator at the terminal Y.

As seen from the signal waveforms of the curves t and Z of FIG. 7, it is possible to obtain a signal in accordance with the phase difference of the applied signal at the terminal X and the applied signal at the terminal Y. Therefore the digital signal mixing circuit of the present invention can also be used for a phase comparator or a phase detector.

In conclusion, the digital signal mixing circuit of the invention has two input terminals X and Y, provides tone burst type output signal having a specified number of cycles of the applied signal at the terminal Y in one cycle of the applied signal at the terminal X. The mixing circuit can also be used to obtain the output signal with an astable period corresponding to a specified number of cycles of the applied signal at the terminal Y in one cycle of the applied signal at the terminal X.

This mixing circuit can mix two different digital signals from two different sources on a time base, so that it is possible to form a monostable circuit, a tone burst wave generator circuit, a phase comparator, etc., of high accuracy. The present invention makes these circuits realizable, and therefore, the industrial value is quite high.

What I claim is:

1. A digital signal mixing circuit comprising:
    an input terminal X,
    an input terminal Y,
    a first bistable circuit which changes the state thereof from a first stable to second stable state when an applied signal level at said terminal X becomes H and an applied signal level at said terminal Y becomes H,
    a second bistable circuit which changes the state thereof from a first stable to second stable state when said first bistable circuit enters into said second stable state and said applied signal level at said terminal Y becomes L,
    a counter circuit which counts the number of cycles of said applied signal at said terminal Y after said second bistable circuit enters into said second stable state, and
    a reset circuit which resets both states of said first and second bistable circuits to said first stable state when an output signal of said counter circuit reaches a target value.

2. A digital signal mixing circuit according to claim 1 wherein:
    said counter circuit has a count reset circuit, which generates a reset signal when said applied signal level at said terminal X turns from L to H and resets an output signal of said counter.

3. A digital signal mixing circuit according to claim 1 further wherein:
    in said first bistable circuit, a signal of the same polarity as an applied signal at said terminal X is applied to one input terminal of a first NAND gate c, a signal of the same polarity as an applied signal at said terminal X is applied to another input terminal of said first NAND gate c, an output signal of said first NAND gate c is applied to one input terminal of a second NAND gate d, an output signal of said second NAND gate d is applied to one input terminal of a third NAND gate e, a reset signal from a reset circuit is applied to the other input terminal of said third NAND gate e, an output signal of said third NAND gate e is applied to the other input terminal of said second NAND gate d, and
    in said second bistable circuit, an output signal of said NAND gate d is applied to one input terminal of a fourth NAND gate g, a signal of opposite polarity to said applied signal at said terminal Y is applied to the other input terminal of said fourth NAND gate g, an output signal of said fourth NAND gate g is applied to one input terminal of a fifth NAND gate h, an output signal of said fifth NAND gate h is applied to one input terminal of a sixth NAND gate i, a reset signal from a reset circuit is applied to the other input terminal of said sixth NAND gate i, an output signal of said sixth NAND gate i is applied to the other input terminal of said fifth NAND gate h.

4. A digital signal mixing circuit according to claim 5 wherein:
    means selected from a combination of even number of inverters and a combination of a specified number of buffers is connected between said output terminal of said fourth NAND gate g and one of said input terminals of said fifth NAND gate h.

5. A digital signal mixing circuit according to claim 3 wherein:
    means selected from a combination of odd number of inverters and a specified number of buffers is connected between said terminal Y and one of said input terminals of said fourth NAND gate g.

6. A digital signal mixing circuit comprising:
    an input terminal X,
    an input terminal Y,
    a first bistable circuit which changes the state thereof from a first stable to second stable state when an applied signal level at said terminal X becomes L and an applied signal level at said terminal Y becomes L,
    a second bistable circuit which changes the state thereof from a first stable to second stable state when said first bistable circuit enters into said second stable state and said applied signal level at said terminal Y becomes H, a counter circuit which counts the number of cycles of said applied signal at said terminal Y after said second bistable circuit enters into said second stable state, a reset circuit which resets both states of said first and second bistable circuit to said first stable state when an output signal of said counter circuit reaches at a target value.

7. A digital signal mixing circuit according to claim 6 wherein:

said counter circuit has a count reset circuit, which generates a reset signal when said applied signal level at said terminal X turns from H to L and resets an output signal of said counter.

8. A digital signal mixing circuit according to claim 8 further wherein:

in said first bistable circuit, a signal of the opposite polarity to an applied signal at said terminal X is applied to one input terminal of a first NAND gate c, a signal of opposite polarity to an applied signal at said terminal X is applied to another input terminal of said first NAND gate c, an output signal of said NAND gate c is applied to one input terminal of a second NAND gate d, an output signal of said second NAND gate d is applied to one input terminal of a third NAND gate e, a reset signal from a reset circuit is applied to the other input terminal of said third NAND gate e, an output signal of said third NAND gate e is applied to the other input terminal of said second NAND gate d, and in said second bistable circuit, an output signal of said NAND gate d is applied to one input terminal of a fourth NAND gate g, a signal of same polarity as said applied signal at said terminal Y is applied to the other input terminal of said fourth NAND gate g, an output signal of said fourth NAND gate g is applied to one input terminal of a fifth NAND gate h, an output signal of said fifth NAND gate h is applied to one input terminal of a sixth NAND gate i, a reset signal from a reset circuit is applied to the other input terminal of said sixth NAND gate i, an output signal of said sixth NAND gate i is applied to the other input terminal of said fifth NAND gate h.

9. A digital signal mixing circuit according to claim 8 wherein:

means selected from a combination of even number of inverters and a combination of a specified number of buffers is connected between said output terminal of said fourth NAND gate g and one of said input terminals of said fifth NAND gate h.

10. A digital signal mixing circuit according to claim 8 wherein:

means selected from a combination of even number of inverters and a specified number of buffers is connected between said terminal Y and one of said input terminals of said fourth NAND gate g.

11. A digital signal mixing circuit comprising;
an input terminal X,
an input terminal Y,
a first bistable circuit which changes the state thereof from a first stable to second stable state when an applied signal level at said terminal X becomes H and an applied signal level at said terminal Y becomes L,
a second bistable circuit which changes the state thereof from a first stable to second stable state when said first bistable circuit enters into said second stable state and said applied signal level at said terminal Y becomes H, a counter circuit which counts the number of cycles of said applied signal at said terminal Y after said second bistable circuit enters into said stable state, a reset circuit which resets both states of said first and second bistable circuits to said first stable state when an output signal of said counter circuit reaches a target value.

12. A digital signal mixing circuit according to claim 11 wherein:

said counter circuit has a count reset circuit, which generates a reset signal when said applied signal level at said terminal X turns from L to H and resets an output signal of said counter.

13. A digital signal mixing circuit according to claim 11 further wherein:

in said first bistable circuit a signal of the same polarity as an applied signal at said terminal X is applied to one input terminal of a first NAND gate c, a signal of opposite polarity to an applied signal at said terminal X is applied to another input terminal of said first NAND gate c, an output signal of said NAND gate c is applied to one input terminal of a second NAND gate d, an output signal of said second NAND gate d is applied to one input terminal of a third NAND gate e, a reset signal from a reset circuit is applied to the other input terminal of said third NAND gate e, an output signal of said third NAND gate e is applied to the other input terminal of said second NAND gate d, and in said second bistable circuit, an output signal of said NAND gate d is applied to one input terminal of a fourth NAND gate g, a signal of same polarity as said applied signal at said terminal Y is applied to the other input terminal of said fourth NAND gate g, an output signal of said fourth NAND gate g is applied to one input terminal of a fifth NAND gate h, an output signal of said fifth NAND gate h is applied to one input terminal of a sixth NAND gate i, a reset signal from a reset circuit is applied to the other input terminal of said sixth NAND gate i, an output signal of said sixth NAND gate i is applied to the other input terminal of said fifth NAND gate h.

14. A digital signal mixing circuit according to claim 13 wherein:

means selected from a combination of even number of inverters and a specified number of buffers is connected between said output terminal of said fourth NAND gate g and one of said input terminals of said fifth gate h.

15. A digital signal mixing circuit according to claim 13 wherein:

means selected from a combination of even number of inverters and a specified number of buffers is connected between said terminal Y and one of said input terminals of said fourth NAND gate g.

16. A digital signal mixing circuit comprising:
an input terminal X,
an input terminal Y,
a first bistable circuit which changes the state thereof from a first stable to second stable state when an applied signal level at said terminal X becomes L and an applied signal level at said terminal Y becomes H,
a second bistable circuit which changes the state thereof from a first stable to second stable state when said first bistable circuit enters into said second stable state and said applied signal level at said terminal Y becomes L, a counter circuit which counts the number of cycles of said applied signal at said terminal Y after said second bistable circuit enters into said second stable state, a reset circuit which resets both states of said first and second bistable circuits to said first stable state when an output signal of said counter circuit reaches a target value.

17. A digital signal mixing circuit according to claim 16 wherein:

said counter circuit has a count reset circuit, which generates a reset signal when a said applied signal level at said terminal X turns from H to L and resets an output signal of said counter.

18. A digital signal mixing circuit according to claim 16 further wherein:

in said first bistable circuit, a signal of opposite polarity to an applied signal at said terminal X is applied to one input terminal of a first NAND gate c, a signal of same polarity as an applied signal at said terminal X is applied to another input terminal of said first NAND gate c, an output signal of said NAND gate c is applied to one input terminal of a second NAND gate d, an output signal of said second NAND gate d is applied to one input terminal of a third NAND gate e, a reset signal from a reset circuit is applied to the other input terminal of said third NAND gate e, an output signal of said third NAND gate e is applied to the other input terminal of said second NAND gate d, in said second bistable circuit, an output signal of said NAND gate d is applied to one input terminal of a fourth NAND gate g, a signal of opposite polarity to said applied signal at said terminal Y is applied to the other input terminal of said fourth NAND gate g, an output signal of said fourth NAND gate g is applied to one input terminal of a fifth NAND gate h, an output signal of said fifth NAND gate h is applied to one input terminal of a sixth NAND gate i, a reset signal from a reset circuit is applied to the other input terminal of said sixth NAND gate i, an output signal of said sixth NAND gate i is applied to the other input terminal of said fifth NAND gate h.

19. A digital signal mixing circuit according to claim 18 wherein:

means selected from a combination of even number of inverters and a specified number of buffers is connected between said output terminal of said fourth NAND gate g and one of said input terminals of said fifth NAND gate h.

20. A digital signal mixing circuit according to claim 18 further wherein:

means selected from a combination of odd number of inverters and a specified number of buffers are connected between said terminal Y and one of said input terminals of said fourth NAND gate g.

* * * * *